United States Patent
Higuma et al.

(10) Patent No.: US 9,474,191 B2
(45) Date of Patent: Oct. 18, 2016

(54) POWER SEMICONDUCTOR MODULE

(71) Applicant: Hitachi Automotive Systems, Ltd., Hitachinaka-shi, Ibaraki (JP)

(72) Inventors: Masato Higuma, Hitachinaka (JP);
Toshifumi Sagawa, Hitachinaka (JP);
Takahiro Shimura, Hitachinaka (JP);
Hideto Yoshinari, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 87 days.

(21) Appl. No.: 14/379,957

(22) PCT Filed: Feb. 8, 2013

(86) PCT No.: PCT/JP2013/052979
§ 371 (c)(1),
(2) Date: Aug. 20, 2014

(87) PCT Pub. No.: WO2013/145881
PCT Pub. Date: Oct. 3, 2013

(65) Prior Publication Data
US 2015/0016063 A1 Jan. 15, 2015

(30) Foreign Application Priority Data
Mar. 30, 2012 (JP) .................. 2012-078794

(51) Int. Cl.
*H05K 7/20* (2006.01)
*H02M 7/00* (2006.01)
(Continued)

(52) U.S. Cl.
CPC ........... *H05K 7/209* (2013.01); *H01L 21/4878* (2013.01); *H01L 23/36* (2013.01); *H01L 23/473* (2013.01); *H02M 7/003* (2013.01); *H05K 5/069* (2013.01); *H05K 7/20927* (2013.01); *H01L 23/3107* (2013.01); *H01L 23/4334* (2013.01); *H01L 23/49562* (2013.01);
(Continued)

(58) Field of Classification Search
CPC ..................... H01L 23/4334; H01L 23/49572
USPC .................. 361/714, 709, 710, 713, 715
See application file for complete search history.

(56) References Cited

U.S. PATENT DOCUMENTS 5,365,107 A * 11/1994 Kuraishi ............. H01L 23/4334
257/673
8,659,130 B2  2/2014  Takagi et al.
(Continued)

FOREIGN PATENT DOCUMENTS

JP  2007-166819 A  6/2007
JP  2010-110143 A  5/2010
(Continued)

OTHER PUBLICATIONS

International Search Report dated May 21, 2013 with English translation thereof {Two (2) pages}.

*Primary Examiner* — Tuan T Dinh
*Assistant Examiner* — Mukund G Patel
(74) *Attorney, Agent, or Firm* — Crowell & Moring LLP

(57) ABSTRACT

Each of a plurality of power semiconductor module includes a can-type cooling case that is formed with a plate spring portion that generates compressive stress in the semiconductor circuit unit, an adjustment portion that is deformed to adjust elastic deformation of the plate spring portion, and a sidewall portion to which the plate spring portion and the adjustment portion are joined.

10 Claims, 23 Drawing Sheets

(51) Int. Cl.
- H01L 23/36 (2006.01)
- H01L 21/48 (2006.01)
- H01L 23/473 (2006.01)
- H05K 5/06 (2006.01)
- H01L 23/31 (2006.01)
- H01L 23/00 (2006.01)
- H01L 23/433 (2006.01)
- H01L 23/495 (2006.01)

(52) U.S. Cl.
CPC .............. *H01L 24/32* (2013.01); *H01L 24/33* (2013.01); *H01L 24/40* (2013.01); *H01L 24/48* (2013.01); *H01L 24/73* (2013.01); *H01L 2224/32245* (2013.01); *H01L 2224/33181* (2013.01); *H01L 2224/40247* (2013.01); *H01L 2224/48091* (2013.01); *H01L 2224/48247* (2013.01); *H01L 2224/73213* (2013.01); *H01L 2224/73215* (2013.01); *H01L 2224/73263* (2013.01); *H01L 2224/73265* (2013.01); *H01L 2924/12042* (2013.01); *H01L 2924/1305* (2013.01); *H01L 2924/1306* (2013.01); *H01L 2924/13055* (2013.01); *H01L 2924/13091* (2013.01); *H01L 2924/3025* (2013.01); *H01L 2924/30107* (2013.01)

(56) References Cited

U.S. PATENT DOCUMENTS

| | | |
|---|---|---|
| 2011/0299265 A1 | 12/2011 | Nakatsu et al. |
| 2013/0062751 A1* | 3/2013 | Takagi ................ H01L 23/3675 257/692 |
| 2013/0094269 A1 | 4/2013 | Maeda et al. |
| 2013/0119525 A1 | 5/2013 | Tsuyuno et al. |

FOREIGN PATENT DOCUMENTS

| | | |
|---|---|---|
| JP | 2011-217550 A | 10/2011 |
| JP | 2011-233606 A | 11/2011 |
| JP | 2012-28595 A | 2/2012 |
| JP | 2013-3961 5 A | 2/2013 |

\* cited by examiner

POWER SEMICONDUCTOR MODULE

TECHNICAL FIELD

The present invention relates to power semiconductor modules that convert DC power into alternating current, and vice versa.

BACKGROUND ART

Among conventional power conversion apparatuses such as inverters and converters, there is a power conversion apparatus that includes power semiconductor modules each containing power semiconductor devices, and a cooler for cooling the power semiconductor modules. In such power semiconductor modules, heat generated in the power semiconductor devices during conduction needs to be released to outside via heat releasing fins, and the key point here is the structure design for improving heat releasing properties within a size limit.

For example, in a power conversion apparatus disclosed in PTL 1, semiconductor modules and cooling tubes are alternately stacked to form a unit. The stack unit is then sandwiched by a holding plate and a plate spring member from the outside, so that the cooling tubes are brought into contact with the semiconductor modules. With the use of the holding plate and the plate spring member, however, the stack unit becomes large in size, and it is difficult to reduce the size of the power conversion apparatus. Moreover, this will lead to an increase in costs.

In a power conversion apparatus disclosed in PTL 2, a semiconductor circuit unit including semiconductor devices is housed in a cylindrical case, and the semiconductor circuit unit is bonded to the inner wall (the heat releasing member) of the case via an insulating member for securing electrical insulation. In this structure, the thinner portions around the heat releasing member spring back away from the semiconductor circuit unit. As a result, tensile stress is generated in the semiconductor circuit unit, and the insulating member might be detached from the inner wall of the case. The detachment of the bonding portion degrades the heat releasing properties of the semiconductor devices, and will lead to damage of the power semiconductors.

CITATION LIST

Patent Literatures

PTL 1: JP 2007-166819 A
PTL 2: JP 2010-110143 A

SUMMARY OF INVENTION

Technical Problem

The object to be achieved by the present invention is to improve reliability of power semiconductor modules that excel in cooling performance.

Solution to Problem

To achieve the above object, a power semiconductor module according to the present invention includes: a circuit unit that includes power semiconductor devices; and a case that houses the circuit unit. The case includes: a first heat releasing plate; a second heat releasing plate that faces the first heat releasing plate, with the circuit unit being interposed therebetween; a first intermediate connecting portion that is connected to the first heat releasing plate and surrounds the first heat releasing plate; a second intermediate connecting portion that is connected to the second heat releasing plate and surrounds the second heat releasing plate; and a sidewall portion connected to the first intermediate connecting portion and the second intermediate connecting portion. The first intermediate connecting portion is designed so that the first heat releasing plate generates first compressive stress in the direction toward the location of the circuit unit, and the second intermediate connecting portion is designed so that the second heat releasing plate generates second compressive stress in the direction toward the location of the circuit unit. The second compressive stress is higher than the first compressive stress. The circuit unit is subjected to compressive stress generated from a difference between the second compressive stress and the first compressive stress. With this structure, the amount of springback in the direction away from the circuit unit can be reduced.

Furthermore, in the power semiconductor module according to the present invention, the thicknesses of the first intermediate connecting portion and the second intermediate connecting portion are smaller than the respective thicknesses of the first heat releasing plate, the second heat releasing plate, and the sidewall portion. The rigidities of the first intermediate connecting portion and the second intermediate connecting portion are lower than the respective rigidities of the first heat releasing plate, the second heat releasing plate, and the sidewall portion.

Further, in the power semiconductor module according to the present invention, where the connecting portion between the first heat releasing plate and the first intermediate connecting portion is defined as a first connecting portion, the connecting portion between the first intermediate connecting portion and the sidewall portion is defined as a second connecting portion, the connecting portion between the second heat releasing plate and the second intermediate connecting portion is defined as a third connecting portion, and the connecting portion between the second intermediate connecting portion and the sidewall portion is defined as a fourth connecting portion, the length of the second intermediate connecting portion from the third connecting portion to the fourth connecting portion is greater than the length of the first intermediate connecting portion from the first connecting portion to the second connecting portion.

Furthermore, in the power semiconductor module according to the present invention, the second intermediate connecting portion has a curved portion.

Further, in the power semiconductor module according to the present invention, the second heat releasing plate has a smaller projective portion than the projective portion of the first heat releasing plate when projected from a direction perpendicular to the facing surface of the first heat releasing plate facing the circuit unit.

Advantageous Effects of Invention

The present invention can improve reliability of power semiconductor modules that excel in cooling performance.

DESCRIPTION OF EMBODIMENTS

The following is a description of embodiments, with reference to the drawings.

Figure 1:
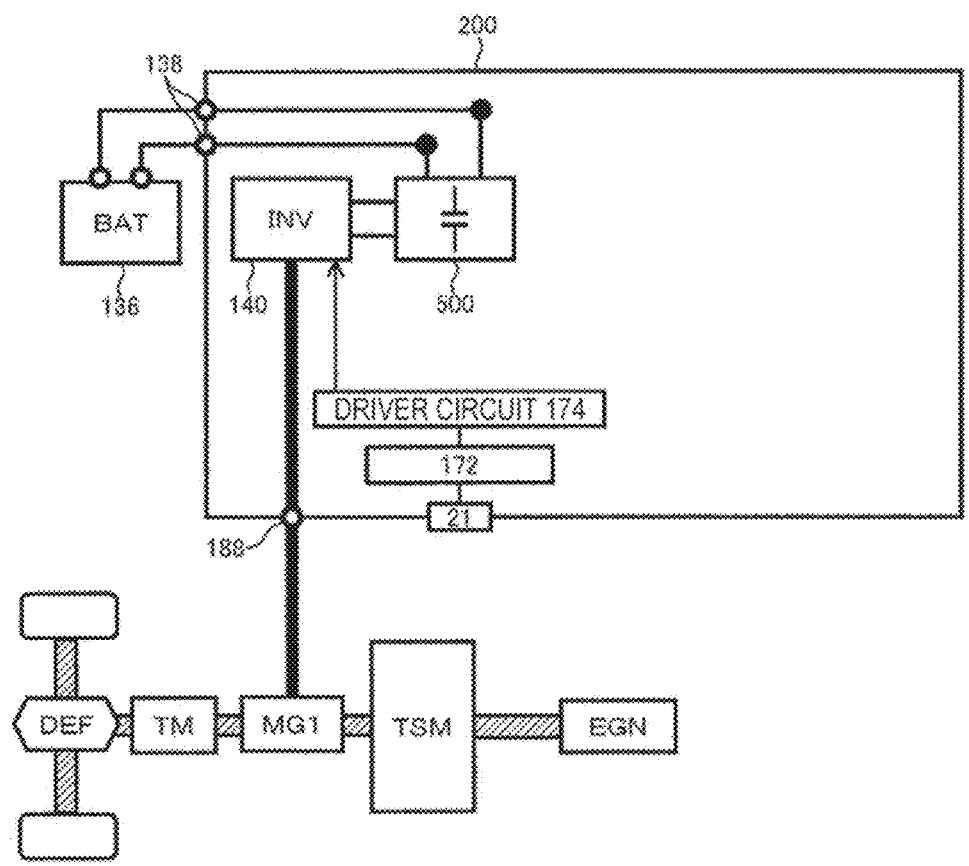
FIG. 1 is a system chart showing the system of a hybrid electric vehicle.
Figure 2:
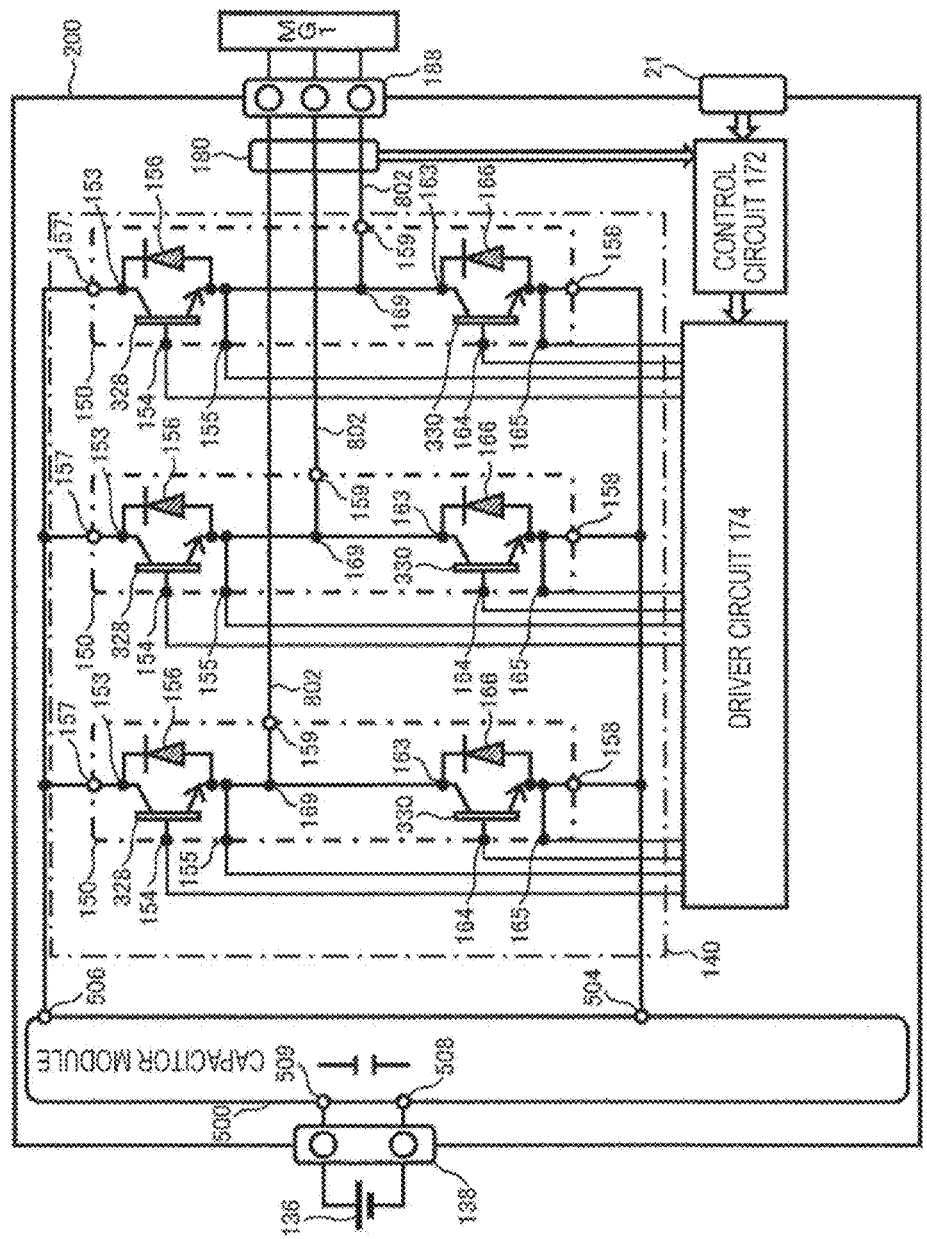
FIG. 2 is a circuit diagram showing the configuration of the electric circuit shown in FIG. 1.

A power conversion apparatus according to an embodiment of the present invention can be used in a hybrid electric vehicle or a conventional electric vehicle. Referring now to FIGS. 1 and 2, the control configuration of a power conversion apparatus according to an embodiment of the present invention applied to a hybrid vehicle, and the circuit configuration of the power conversion apparatus are described as a typical example of a power conversion apparatus.

FIG. 1 is a diagram showing the control blocks of a hybrid electric vehicle (hereinafter referred to as "HEV"). An engine EGN and a motor generator MG1 generate a running torque of the vehicle. The motor generator MG1 has the function not only to generate a rotary torque but also to convert mechanical energy applied to the motor generator MG1 from outside into electrical power.

The motor generator MG1 is a synchronous machine or an induction machine, for example, and operates as a motor or a generator as described above, depending on the driving method. In a case where the motor generator MG1 is mounted on a vehicle, it is preferable to achieve high output power with a small-size structure. A permanent-magnet synchronous motor using magnets made of neodymium or the like is suitable. A permanent-magnet synchronous motor generates less heat from its rotator than an induction motor, and in this aspect also, excels as a motor for vehicles.

An output torque from the output side of the engine EGN is transmitted to the motor generator MG1 via a power transfer mechanism TSM, and a rotary torque from the power transfer mechanism TSM or a rotary torque generated by the motor generator MG1 is transmitted to the wheels via a transmission TM and a differential gear mechanism DEF. Meanwhile, when regenerative braking is being performed, a rotary torque is transmitted from the wheels to the motor generator MG1, and AC power is generated based on the supplied rotary torque. The generated AC power is converted into DC power by a power conversion apparatus 200 as described above, to charge a high-voltage battery 136. The charged electrical power is again used as running energy.

Next, the power conversion apparatus 200 is described. An inverter circuit 140 is electrically connected to the battery 136 via a DC connector 138, and electrical power is exchanged between the battery 136 and the inverter circuit 140. In a case where the motor generator MG1 is operated as a motor, the inverter circuit 140 generates AC power based on DC power supplied from the battery 136 via the DC connector 138, and supplies the AC power to the motor generator MG1 via an AC terminal 188. The structure formed with the motor generator MG1 and the inverter circuit 140 operates as a first motor generator unit.

In this embodiment, the first motor generator unit is operated as a motor unit by the electrical power of the battery 136, so that the wheels can be driven only by the power of the motor generator MG1. Furthermore, in this embodiment, the first motor generator unit is operated as a generator unit by the power of the engine 120 or the power from the wheels, and is caused to generate electrical power, so that the battery 136 can be charged.

Although not shown in FIG. 1, the battery 136 is also used as the power source for driving the motor for an auxiliary machine. The auxiliary-machine motor may be the motor for driving the compressor of an air conditioner, or the motor for driving a control hydraulic pump, for example. DC power is supplied from the battery 136 to an auxiliary-machine power semiconductor module, and the auxiliary-machine power semiconductor module generates AC power and supplies the AC power to the auxiliary-machine motor. The auxiliary-machine power semiconductor module basically has the same circuit configuration and the same function as those of the inverter circuit 140, and controls the phase and frequency of the alternating current and the electrical power to be supplied to the auxiliary-machine motor. The power conversion apparatus 200 includes a capacitor module 500 for smoothing the DC power to be supplied to the inverter circuit 140.

The power conversion apparatus 200 includes a connector 21 for communications for receiving a command from a host control apparatus or transmitting data indicating a status to the host control apparatus. The power conversion apparatus 200 calculates the amount of control on the motor generator MG1 at a control circuit 172 based on a command that is input through the connector 21, determines whether to operate the motor generator MG1 as a motor and whether to operate the motor generator MG1 as a generator, generates a control pulse based on a result of the determination, and supplies the control pulse to a driver circuit 174. Based on the supplied control pulse, the driver circuit 174 generates a drive pulse for controlling the inverter circuit 140.

Referring now to FIG. 2, the electrical circuit configuration of the inverter circuit 140 is described. In the description below, insulated gate bipolar transistors are used as semiconductor devices, and will be written simply as "IGBTs". IGBTs 328 and diodes 156 that function as upper arms, and IGBTs 330 and diodes 166 that function as lower arms constitute series circuits 150 of upper and lower arms. The inverter circuit 140 includes the series circuits 150 corresponding to the three phases of the U-phase, the V-phase, and the W-phase of the AC power to be output.

Those three phases correspond to the respective phase windings of the three phases of the armature windings of the motor generator MG1 of this embodiment. The series circuit 150 of the upper and lower arms of each of the three phases outputs alternating current from an intermediate electrode 169 that is the midpoint portion of the series circuit. This intermediate electrode 169 is connected to AC bus bars 802 and 804 through an AC terminal 159 and an AC terminal 188. The AC bus bars described later are AC power lines leading to the motor generator MG1.

The collector electrodes 153 of the IGBTs 328 of the upper arms are electrically connected to a capacitor terminal 506 on the positive side of the capacitor module 500 via positive terminals 157. The emitter electrodes of the IGBTs 330 of the lower arms are electrically connected to capacitor terminals 504 on the negative side of the capacitor module 500 via negative terminals 158.

As described above, the control circuit 172 receives a control command form the host control apparatus via the connector 21, and, based on the control command, generates a control pulse as a control signal for controlling the IGBTs 328 and the IGBTs 330 forming the upper arms and the lower arms of the respective phase series circuits 150 constituting the inverter circuit 140. The control pulse is then supplied to the driver circuit 174.

Based on the control pulse, the driver circuit 174 supplies a drive pulse for controlling the IGBTs 328 and the IGBTs 330 forming the upper arms and the lower arms of the series circuits 150 of the respective phases, to the IGBTs 328 and the IGBTs 330 of the respective phases. Based on the drive pulse from the driver circuit 174, the IGBTs 328 and the IGBTs 330 perform conducting or breaking operations, to convert DC power supplied from the battery 136 into three-phase AC power. The converted electrical power is supplied to the motor generator MG1.

The IGBTs 328 each include the collector electrode 153, an emitter electrode 155 for signals, and a gate electrode 154. The IGBTs 330 each include a collector electrode 163, an emitter electrode 165 for signals, and a gate electrode 164. A diode 156 is electrically connected between each collector electrode 153 and each corresponding emitter electrode 155. Likewise, a diode 166 is electrically connected between each collector electrode 163 and each corresponding emitter electrode 165.

As the power semiconductor devices for switching, metal-oxide semiconductor field-effect transistors (hereinafter written simply as "MOSFETs") may be used. In that case, the diodes 156 and the diodes 166 are not necessary. As the power semiconductor devices for switching, IGBTs are suitable when the DC voltage is relatively high, and MOSFETs are suitable when the DC voltage is relatively low.

The capacitor module 500 includes the capacitor terminal 506 on the positive side, the capacitor terminal 504 on the negative side, a supply terminal 509 on the positive side, and a supply terminal 508 on the negative side. High-voltage DC power from the battery 136 is supplied to the supply terminal 509 on the positive side and the supply terminal 508 on the negative side via the DC connector 138, and is then supplied to the inverter circuit 140 from the capacitor terminal 506 on the positive side and the capacitor terminal 504 of the negative side of the capacitor module 500.

On the other hand, DC power converted from AC power by the inverter circuit 140 is supplied to the capacitor module 500 from the capacitor terminal 506 on the positive side and the capacitor terminal 504 on the negative side. The DC power is then supplied to the battery 136 from the supply terminal 509 on the positive side and the supply terminal 508 on the negative side via the DC connector 138, and is accumulated in the battery 136.

The control circuit 172 includes a microcomputer for calculating switching timings of the IGBTs 328 and the IGBTs 330. Information to be input to the microcomputer includes the target torque value required for the motor generator MG1, the value of the current to be supplied from the series circuits 150 to the motor generator MG1, and the magnetic pole position of the rotator of the motor generator MG1.

The target torque value is based on a command signal that is output from the host control apparatus (not shown). The value of the current is detected based on a signal detected by a current sensor 180. The magnetic pole position is detected based on a detection signal that is output from a rotational magnetic pole sensor (not shown) such as a resolver provided in the motor generator MG1. Although the current sensor 180 detects the value of a three-phase current in this embodiment, the value of a two-phase current may be detected, and a three-phase current may be determined through a calculation.

The microcomputer in the control circuit 172 calculates current command values of the d-axis and the q-axis of the motor generator MG1 based on the target torque value, calculates voltage command values of the d-axis and the q-axis based on the calculated current command values of the d-axis and the q-axis and the difference between detected current values of the d-axis and the q-axis, converts the calculated voltage command values of the d-axis and the q-axis into voltage command values of the U-phase, the V-phase, and the W-phase based on the detected magnetic pole positions. The microcomputer then generates pulse-like modulation waves in accordance with a comparison between the fundamental waves (sinusoidal waves) and carrier waves (triangular waves) based on the voltage command values of the U-phase, the V-phase, and the W-phase, and outputs the generated modulation waves as PWM (pulse width modulation) signals to the driver circuit 174.

When driving the lower arms, the driver circuit 174 outputs drive signals generated by amplifying the PWM signals to the gate electrodes of the IGBTs 330 of the lower arms. When driving the upper arms, the driver circuit 174 amplifies the PWM signals after shifting the level of the reference voltage of the PWM signals to the level of the reference voltage of the upper arms, and outputs the amplified PWM signals as drive signals to the gate electrodes of the IGBT 328 of the upper arms.

The microcomputer in the control circuit 172 also senses errors (such as overcurrent, overvoltage, and over-temperature), to protect the series circuits 150. Therefore, sensing information is input to the control circuit 172. For example, information about the current flowing in the respective emitter electrodes of the IGBTs 328 and the IGBTs 330 is input to corresponding drive units (ICs) from the emitter electrodes 155 for signals and the emitter electrodes 165 for signals of the respective arms. As a result, each of the drive units (ICs) performs overcurrent sensing. When sensing overcurrent, each of the drive units (ICs) stops the switching operation of the corresponding one of the IGBT 328 and the IGBT 330, and protects the corresponding one of the IGBT 328 and the IGBT 330 from the overcurrent.

Information about the temperatures of the series circuits 150 is input to the microcomputer from temperature sensors (not shown) provided in the series circuits 150. Information about the voltages on the DC positive sides of the series circuits 150 is also input to the microcomputer. The microcomputer performs over-temperature sensing and overvoltage sensing based on the information, and stops the switching operations of all the IGBTs 328 and the IGBTs 330 when sensing over-temperature or overvoltage.

Figure 3:
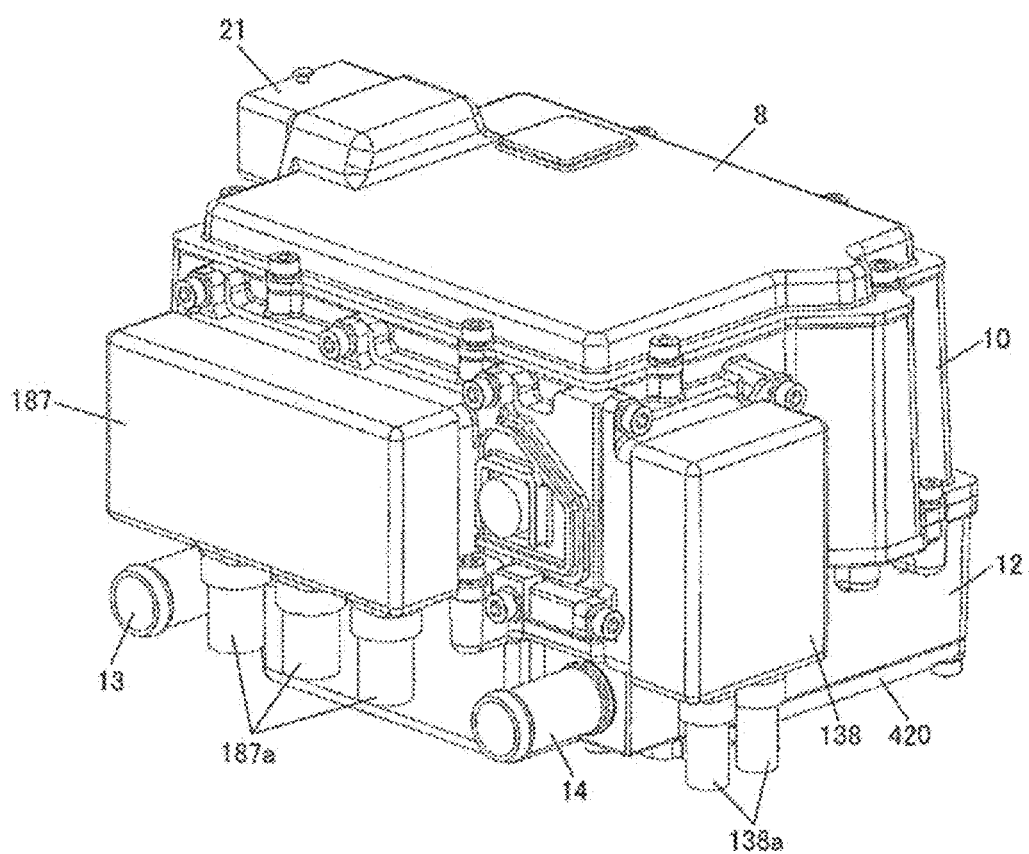
FIG. 3 is an external perspective view of a power conversion apparatus 200 as an embodiment according to the present invention.
Figure 4:
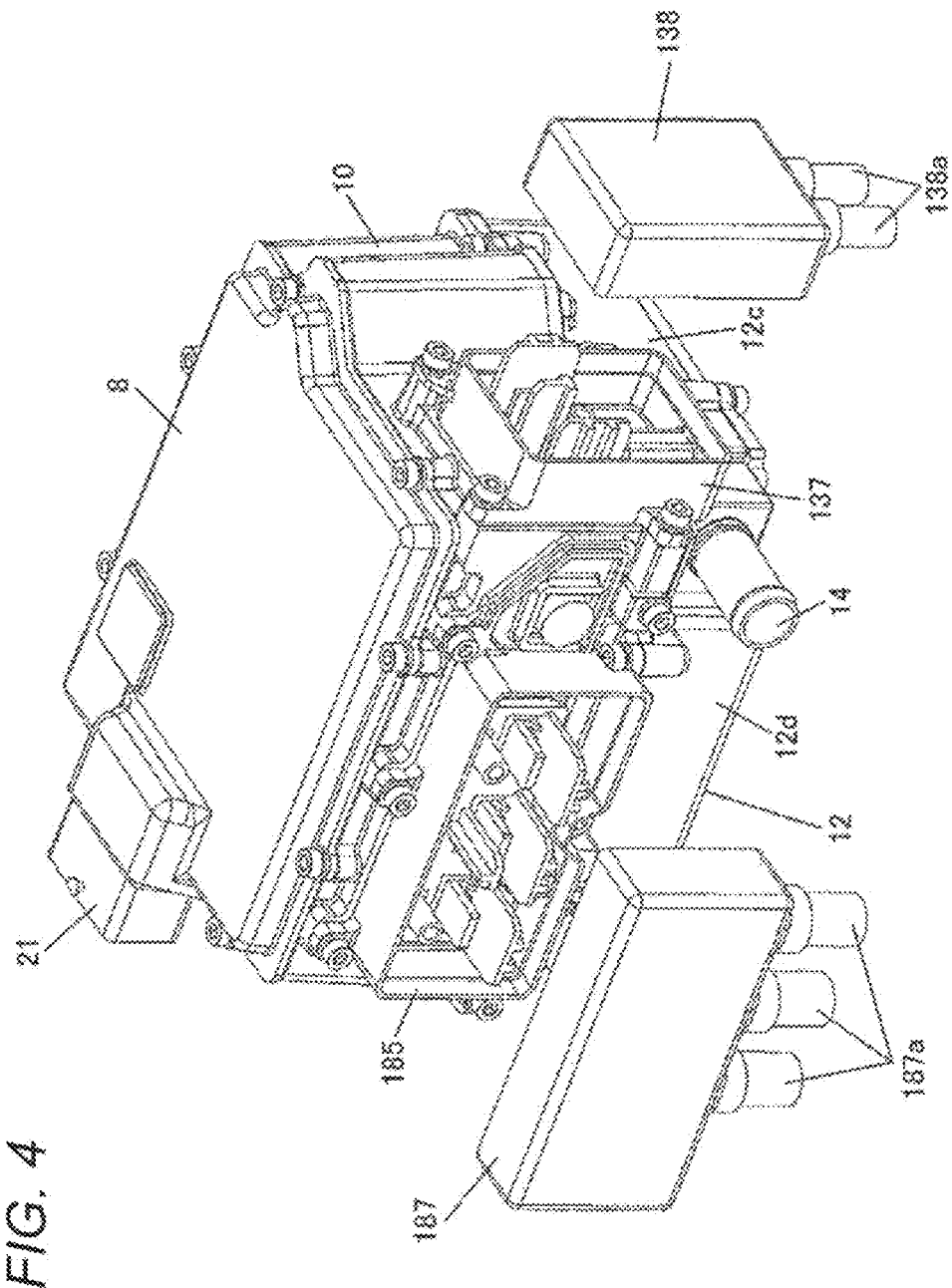
FIG. 4 is an external perspective view of the power conversion apparatus 200 as an embodiment according to the present invention.

FIGS. 3 and 4 are external perspective views of the power conversion apparatus 200 as an embodiment of the present invention. FIG. 4 illustrates a situation where an AC connector 187 and the DC connector 138 are removed. Being a rectangular parallelepiped substantially having a planar shape of a square, the power conversion apparatus 200 of this embodiment can be made smaller in size, and can be readily mounted on a vehicle. Reference numeral 8 denotes a lid, reference numeral 10 denotes a housing, reference numeral 12 denotes a flow channel forming unit, reference numeral 13 denotes a cooling medium inlet pipe, reference numeral 14 denotes an outlet pipe, and reference numeral 420 denotes a bottom cover. The connector 21 is a signal connector provided for a connection to the outside.

The lid 8 is secured to the upper opening portion of the housing 10 in which the circuit components constituting the power conversion apparatus 200 are housed. The flow channel forming unit 12 secured to the bottom portion of the housing 10 holds power semiconductor modules 300 described later and the capacitor module 500, and cools those modules with a cooling medium. The cooling medium is water in many cases, and will be hereinafter described as a refrigerant. The inlet pipe 13 and the outlet pipe 14 are placed on a side surface of the flow channel forming unit 12, and the refrigerant supplied through the inlet pipe 13 flows into a later described flow channel 19 in the flow channel forming unit 12, and is discharged through the outlet pipe 14. It should be noted that changes in the inflow and outflow directions of the refrigerant do not greatly affect cooling efficiency and pressure loss. That is, if the refrigerant flows in through the outlet pipe 14 and flows out through the inlet pipe 13, cooling efficiency and pressure loss hardly change. As the positions of the inlet pipe 13 and the outlet pipe 14 are symmetrical about the midsection of the power conversion apparatus 200, the power conversion apparatus 200 according to this embodiment has the advantage of being able to change the arrangement in accordance with the layout of the wirings of the refrigerant pipe of the vehicle.

An AC interface 185 to which the AC connector 187 is attached, and a DC interface 137 to which the DC connector 138 is attached are placed on side surfaces of the housing 10. The AC interface 185 is placed on the side surface on which the pipes 13 and 14 are placed, and the AC wirings 187a of the AC connector 187 attached to the AC interface 185 extend downward between the pipes 13 and 14. The DC interface 137 is placed on a side surface adjacent to the side surface on which the AC interface 185 is placed, and the DC wirings 138a of the DC connector 138 attached to the DC interface 137 also extend downward with respect to the power conversion apparatus 200.

Figure 5:
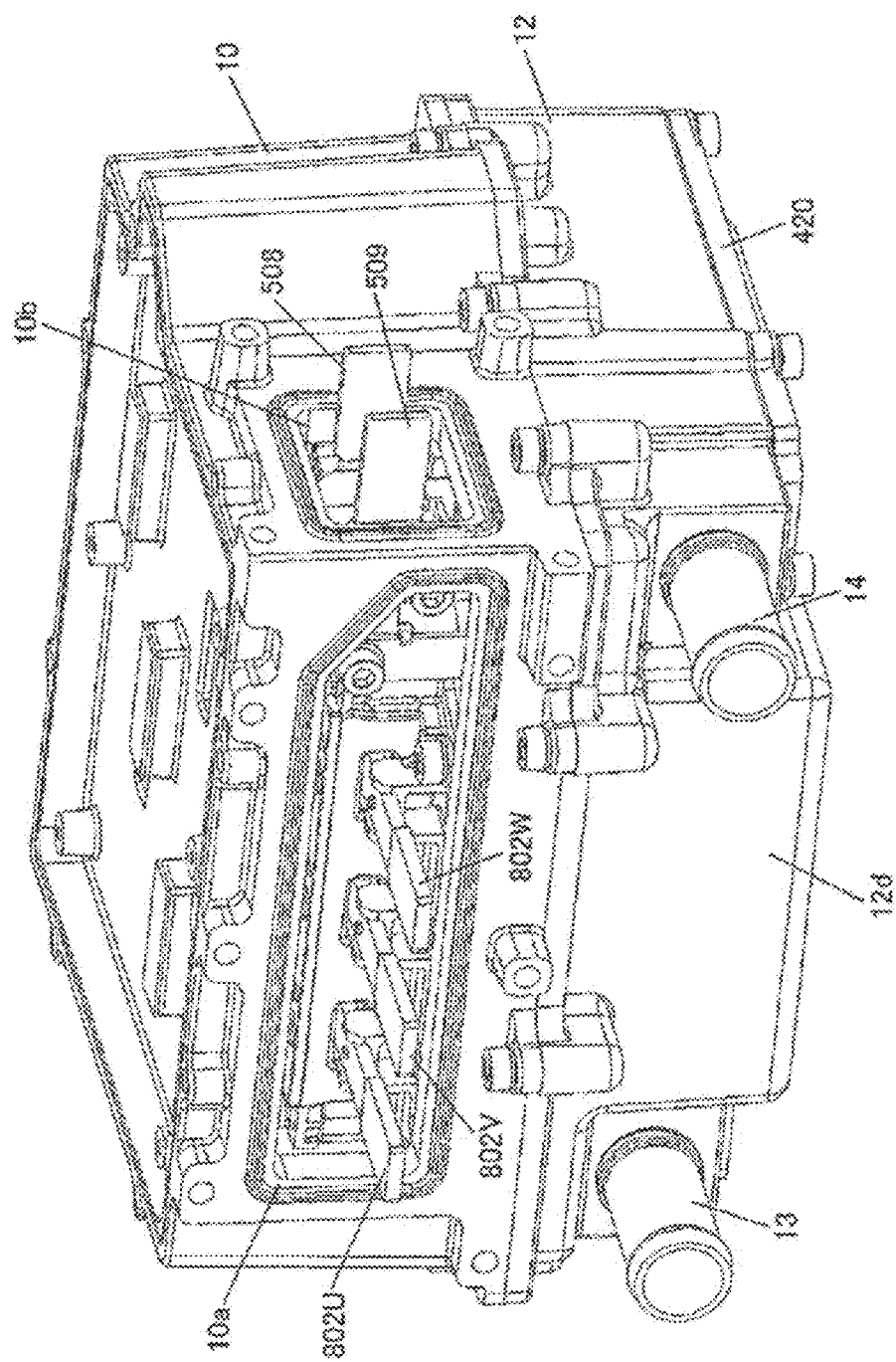
FIG. 5 is a diagram showing a situation where a lid 8, a DC interface 137, and an AC interface 185 are detached from the power conversion apparatus 200 shown in FIG. 4.
Figure 6:
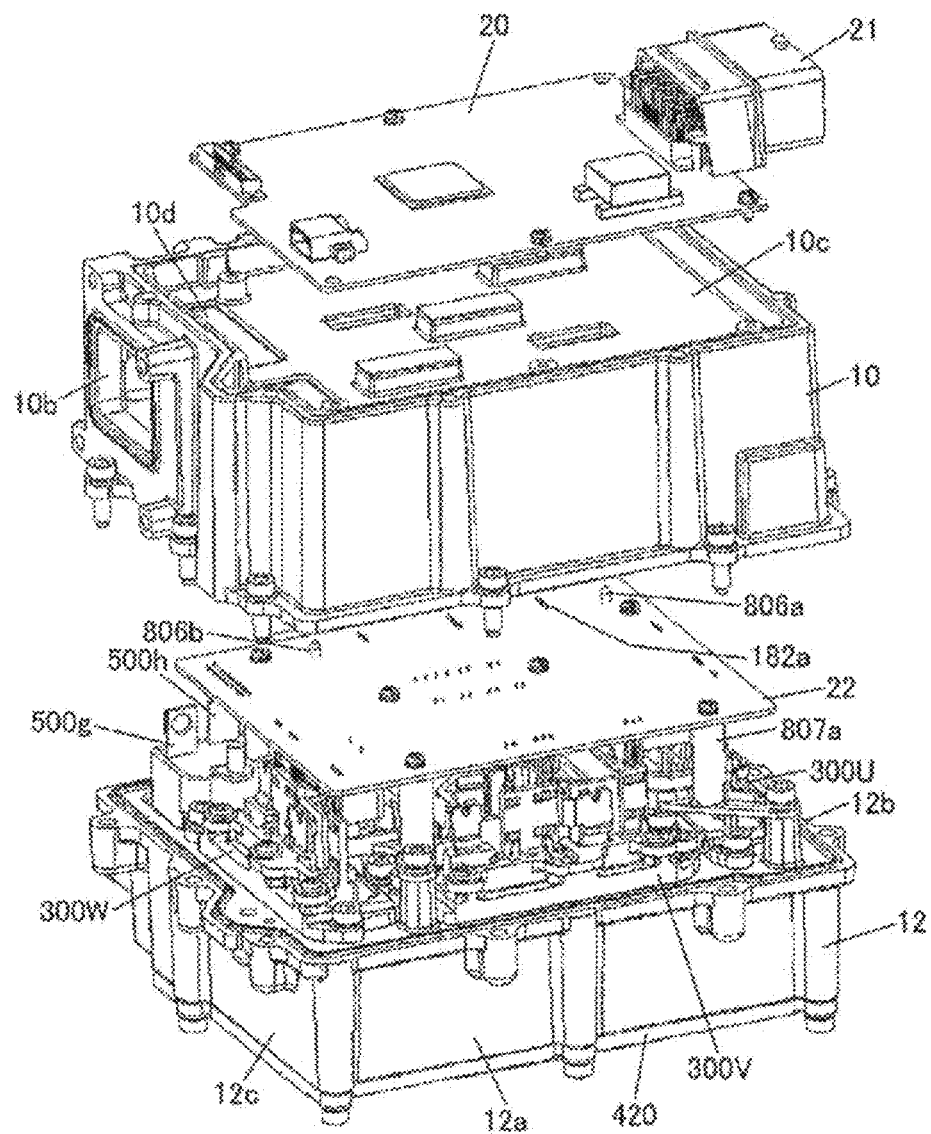
FIG. 6 is a diagram showing a situation where a housing 10 is detached from a flow channel forming unit 12 shown in FIG. 5.
Figure 7:
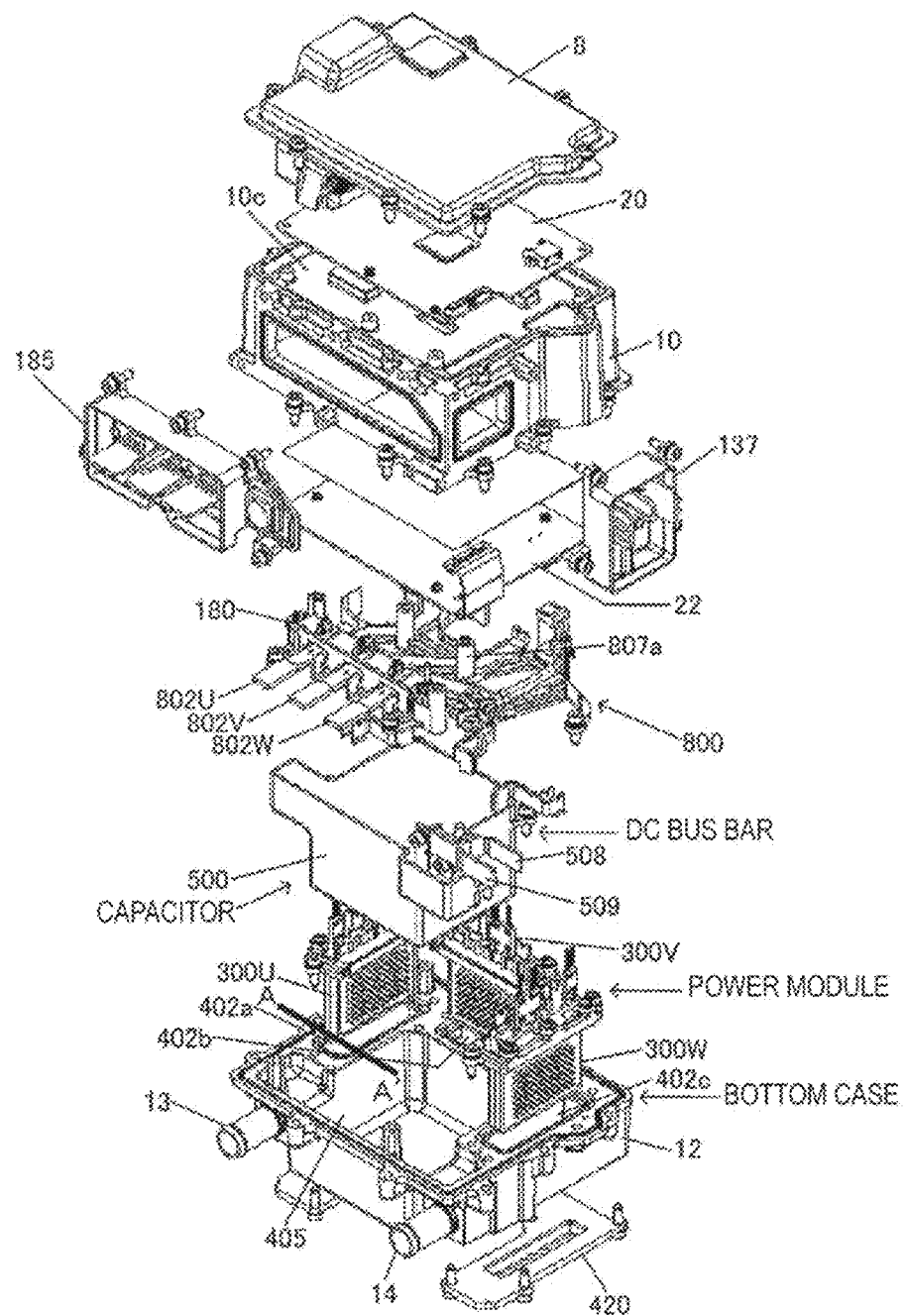
FIG. 7 is an exploded perspective view of the power conversion apparatus 200.

As the AC interface 185 and the pipes 13 and 14 are placed on the same side surface 12d, and the AC wirings 187a extend downward so as to pass between the pipes 13 and 14 as described above, the space occupied by the pipes 13 and 14, the AC connector 187, and the AC wirings 187a can be made smaller, and an increase in size of the entire apparatus can be reduced. Also, as the AC wirings 187a extend downward with respect to the pipes 13 and 14, handling of the AC wirings 187a becomes easier, and productivity becomes higher. FIG. 5 is a diagram showing a state where the lid 8, the DC interface 137, and the AC interface 185 are detached from the power conversion apparatus 200 shown in FIG. 4. An opening 10a to which the AC interface 185 is to be secured is formed in one side surface of the housing 10, and an opening 10b to which the DC interface 137 is to be secured is formed in an adjacent other side surface. Three AC bus bars 802, which are a U-phase AC bus bar 802U, a V-phase AC bus bar 802V, and a W-phase AC bus bar 802W, protrude through the opening 10a, and supply terminals 508 and 509 of the DC side protrude through the opening 10b. FIG. 6 is a diagram showing a state where the housing 10 is detached from the flow channel forming unit 12 shown in FIG. 5. The housing 10 has two accommodation spaces, which are separated as an upper housing space and a lower housing space by a partition wall 10c. A control circuit board 20 to which the connector 21 is secured is housed in the upper housing space, and a driver circuit board 22 and a bus bar assembly 800 described later are housed in the lower housing space. The control circuit 172 shown in FIG. 2 is mounted on the control circuit board 20, and the driver circuit 174 is mounted on the driver circuit board 22. The control circuit board 20 and the driver circuit board 22 are connected by a flat cable (not shown in the drawing but described later with reference to FIG. 7), and the flat cable extends from the lower housing space to the upper housing space, passing through a slit-like opening 10d formed in the partition wall 10c. FIG. 7 is an exploded perspective view of the power conversion apparatus 200. Inside the lid 8, or in the upper housing space of the housing 10, the control circuit board 20 having the control circuit 172 mounted thereon as described above is placed. An opening 5J for the connector 21 is formed in the lid 8. Low-voltage DC power for operating the control circuit in the power conversion apparatus 200 is supplied through the connector 21.

As will be described later in detail, a flow channel in which the refrigerant flowing in through the inlet pipe 13 is formed in the flow channel forming unit 12. The flow channel is a U-shaped flow channel extending along three side surfaces of the flow channel forming unit 12. The refrigerant flowing in through the inlet pipe 13 flows into the flow channel from one end of the U-shaped flow channel, and flows out through the outlet pipe 14 connected to the other end of the flow channel after flowing through the flow channel.

Three openings 402a through 402c are formed in the upper surface of the flow channel, and power semiconductor modules 300U, 300V, and 300W containing the series circuits 150 (see FIG. 1) are inserted into the flow channel via the openings 402a through 402c. The U-phase series circuit 150 is contained in the power semiconductor module 300U, the V-phase series circuit 150 is contained in the power semiconductor module 300V, and the W-phase series circuit 150 is contained in the power semiconductor module 300W. These power semiconductor modules 300U through 300W have the same structures, and the external shapes thereof are also the same. The openings 402a through 402c are filled with flange portions of the inserted power semiconductor modules 300U through 300W.

In the flow channel forming unit 12, a housing space 405 for housing electric components is formed so as to be surrounded by the U-shaped flow channel. In this embodiment, the capacitor module 500 is housed in this housing space 405. The capacitor module 500 housed in the housing space 405 is cooled by the refrigerant flowing in the flow channel. The bus bar assembly 800 having the AC bus bars 802U through 802W mounted thereon is placed on the capacitor module 500. The bus bar assembly 800 is secured to the upper surface of the flow channel forming unit 12. The current sensor 180 is secured to the bus bar assembly 800.

The driver circuit board 22 is secured to a supporting member 807a provided in the bus bar assembly 800, and is placed on the bus bar assembly 800. As described above, the control circuit board 20 and the driver circuit board 22 are connected by a flat cable 23. The flat cable extends from the lower housing space to the upper housing space, passing through the slit-like opening 10d formed in the partition wall 10c.

As described above, the power semiconductor modules 300U through 300W, the driver circuit board 22, and the control circuit board 20 are arranged hierarchically in the vertical direction, and the control circuit board 20 is located furthest away from the power semiconductor modules 300U through 300W of a strong current system. Accordingly, leakage of switching noise and the like into the side of the control circuit board 20 can be reduced. Furthermore, the driver circuit board 22 and the control circuit board are placed in different housing spaces partitioned by the partition wall 10c. Accordingly, the partition wall 10c functions as an electromagnetic shield, and noise leakage from the driver circuit board 22 into the control circuit board 20 can be reduced. The housing 10 is made of a metal material such as aluminum.

Furthermore, as the control circuit board 20 is secured to the partition wall 10c formed integrally with the housing 10, the mechanical resonance frequency of the control circuit board 20 with respect to vibration from outside becomes higher. Accordingly, influence of vibration from the vehicle is small, and reliability is increased.

Figure 8:
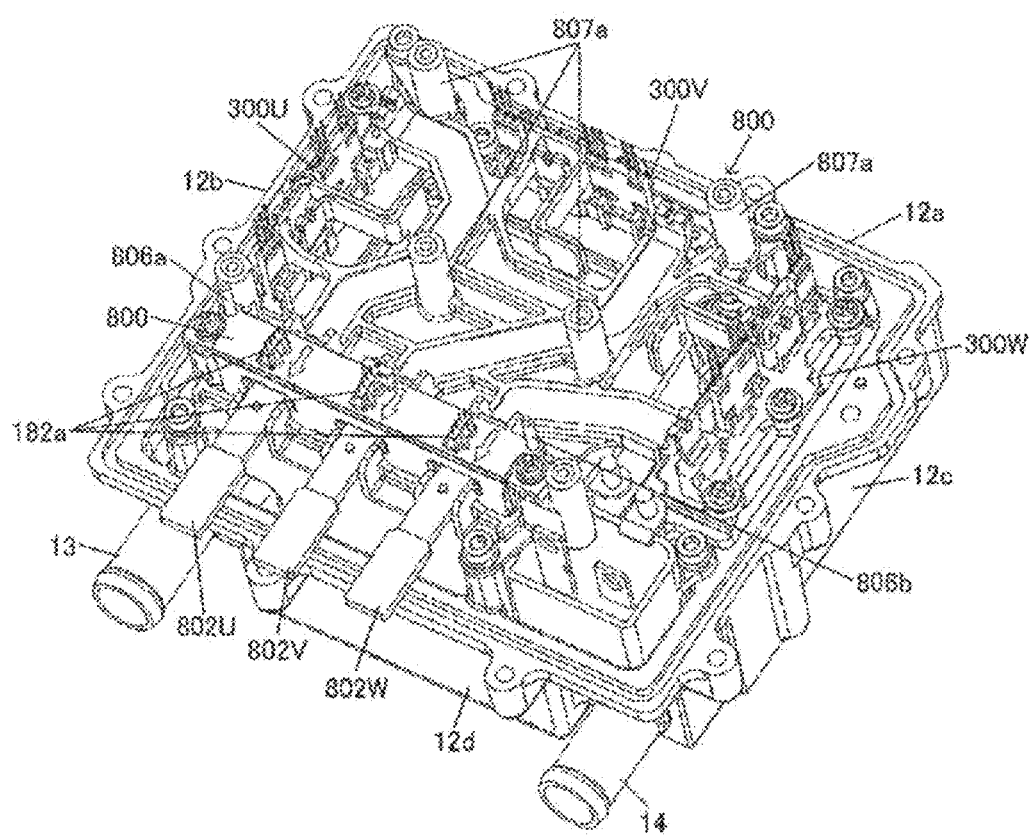
FIG. 8 is an external perspective view of the flow channel forming unit 12 having power semiconductor modules 300U through 300W, a capacitor module 500, and a bus bar assembly 800 assembled therein.
Figure 9:
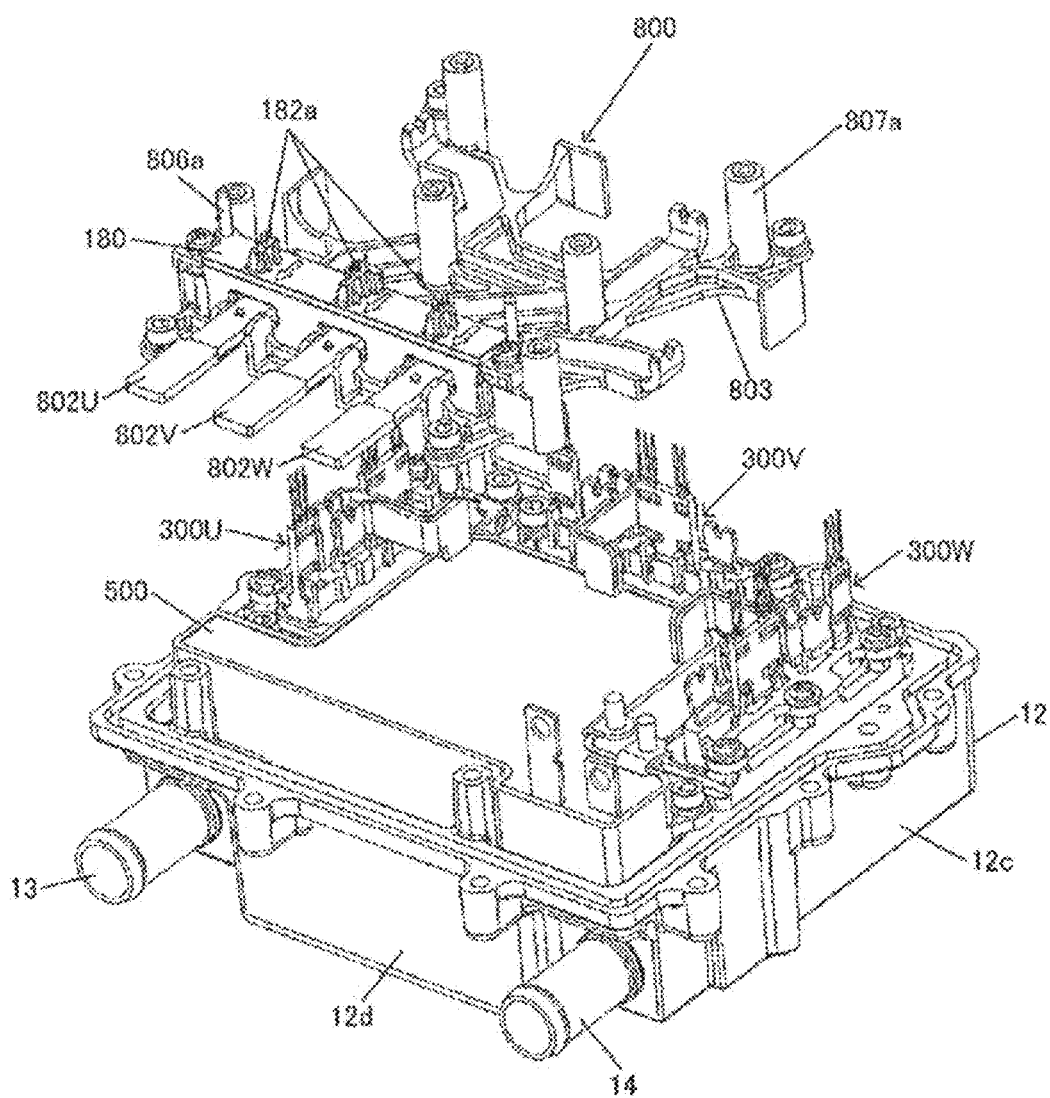
FIG. 9 shows a situation where the bus bar assembly 800 is detached from the flow channel forming unit 12.

In the description below, the flow channel forming unit 12, and the power semiconductor modules 300U through 300W, the capacitor module 500, and the bus bar assembly 800, which are secured to the flow channel forming unit 12, are described in greater detail. FIG. 8 is an external perspective view of the flow channel forming unit 12 having the power semiconductor modules 300U through 300W, the capacitor module 500, and the bus bar assembly 800 assembled therein. FIG. 9 shows a state where the bus bar assembly 800 is detached from the flow channel forming unit 12. The bus bar assembly 800 is bolted to the flow channel forming unit 12.

Figure 10:
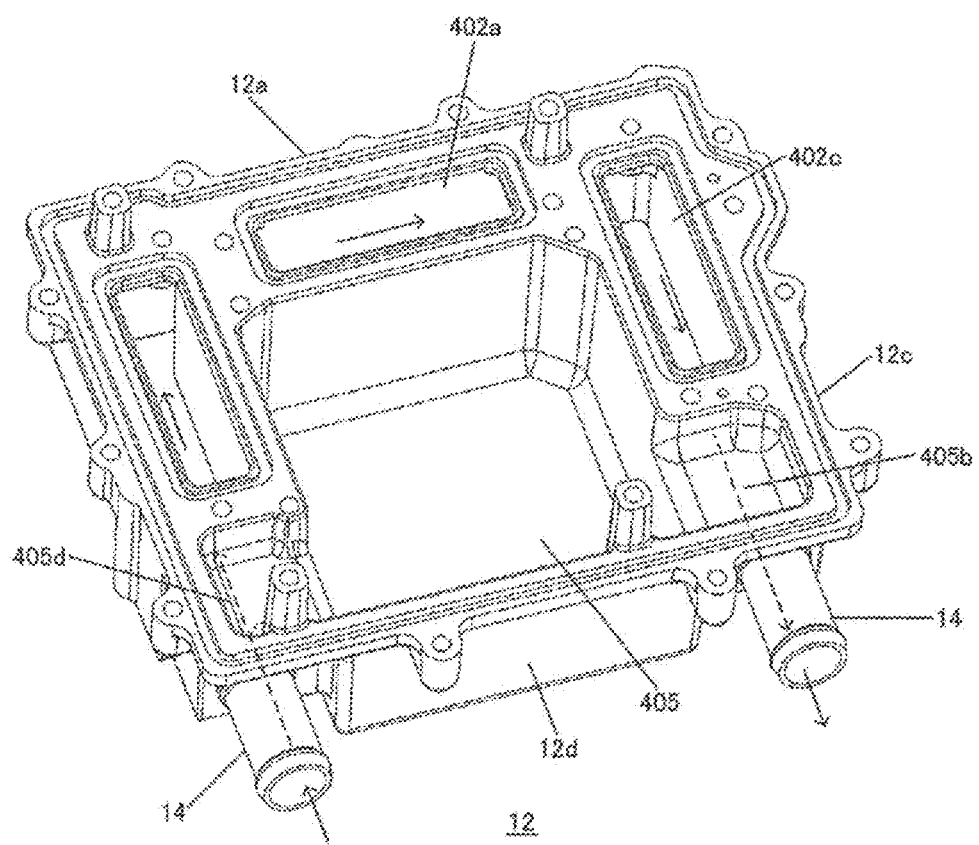
FIG. 10 is a perspective view of the flow channel forming unit 12.
Figure 11:
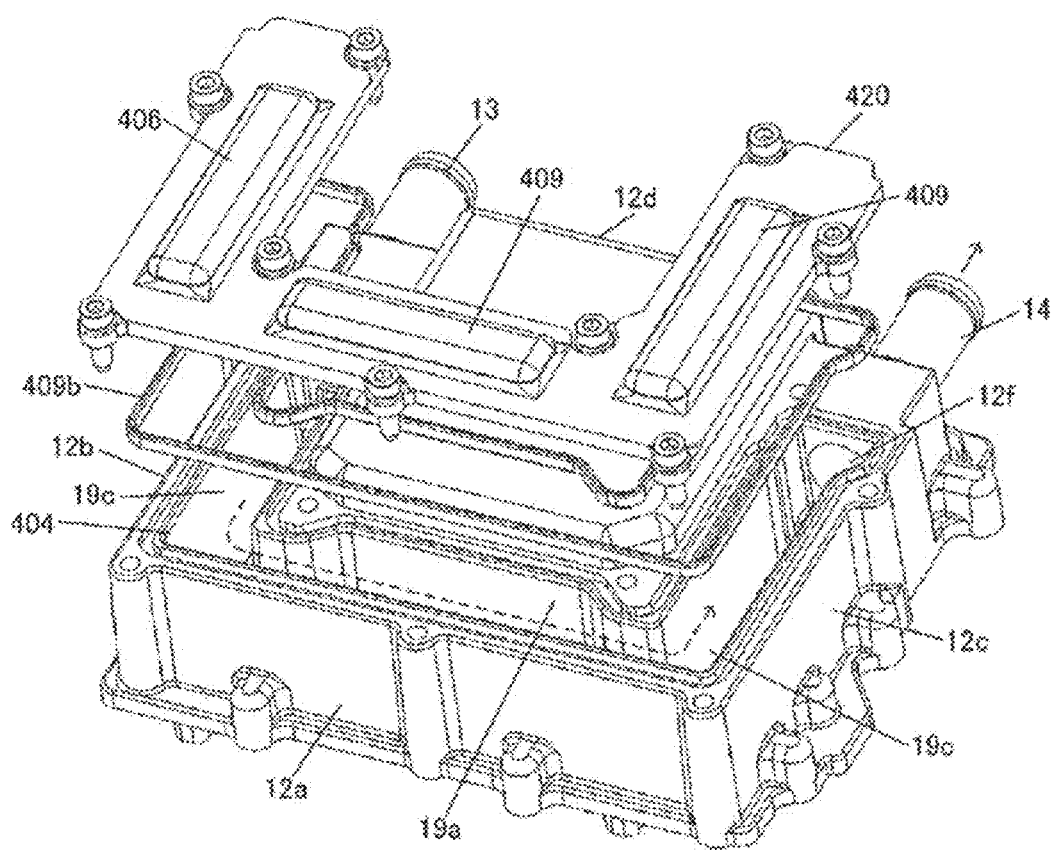
FIG. 11 is an exploded perspective view of the flow channel forming unit 12, seen from the bottom surface side.

Referring first to FIGS. 10 and 11, the flow channel forming unit 12 is described. FIG. 10 is a perspective view of the flow channel forming unit 12. FIG. 11 is an exploded perspective view of the flow channel forming unit 12, seen from the bottom surface side. As shown in FIG. 10, the flow channel forming unit 12 is a rectangular parallelepiped substantially having a planar shape of a square, and the inlet pipe 13 and the outlet pipe 14 are formed on the side surface 12d. In the side surface 12d, the portions having the pipes 13 and 14 formed thereon are designed to be step-like portions. As shown in FIG. 11, the flow channel 19 is a U-shaped channel extending along the other three side surfaces 12a through 12c. In the bottom surface of the flow channel forming unit 12, a U-shaped continuous opening 404 having almost the same shape as the shape of the flow channel 19 in traverse section is formed. This opening 404 is covered with the U-shaped bottom cover 420. A sealing member 409a is provided between the bottom cover 420 and the flow channel forming unit 12, to maintain airtightness.

The U-shaped flow channel 19 is divided into three flow channel zones 19a, 19b, and 19c in accordance with refrigerant flowing directions. As will be described later in detail, the first flow channel zone 19a is formed along the side surface 12a located in a position facing the side surface 12d having the pipes 13 and 14 formed thereon. The second flow channel zone 19b is formed along the side surface 12b adjacent to one side of the side surface 12a. The third flow channel zone 19c is formed along the side surface 12c adjacent to the other side of the side surface 12a. The refrigerant flows into the flow channel zone 19b through the inlet pipe 13, flows through the flow channel zone 19b, the flow channel zone 19a, and the flow channel zone 19c in this order as indicated by an arrow with a dashed line, and flows out through the outlet pipe 14.

As shown in FIG. 10, in the upper surface of the flow channel forming unit 12, the rectangular opening 402a parallel to the side surface 12a is formed in the position facing the flow channel zone 19a, the rectangular opening 402b parallel to the side surface 12b is formed in the position facing the flow channel zone 19b, and the rectangular opening 402c parallel to the side surface 12c is formed in the position facing the flow channel zone 19c. The power semiconductor modules 300U through 300W are inserted into the flow channel 19 via the openings 402a through 402c. As shown in FIG. 11, in the bottom cover 420, convex portions 406 that protrude downward with respect to the flow channel 19 are formed in the positions facing the above described openings 402a through 402c. These convex portions 406 are concavities when seen from the flow channel 19, and the lower edge portions of the power semiconductor modules 300U through 300W inserted via the openings 402a through 402c fill these concavities. As the opening 404 is designed to face the openings 402a through 402c, the flow channel forming unit 12 can be easily manufactured by aluminum casting.

As shown in FIG. 10, the rectangular housing space 405 designed to be surrounded by the flow channel 19 at three sides is formed in the flow channel forming unit 12. The capacitor module 500 is housed in this housing space 405. As the housing space 405 surrounded by the flow channel 19 has the shape of a rectangular parallelepiped, the capacitor module 500 can be shaped into a rectangular parallelepiped, and productivity of the capacitor module 500 is improved.

Figure 12:
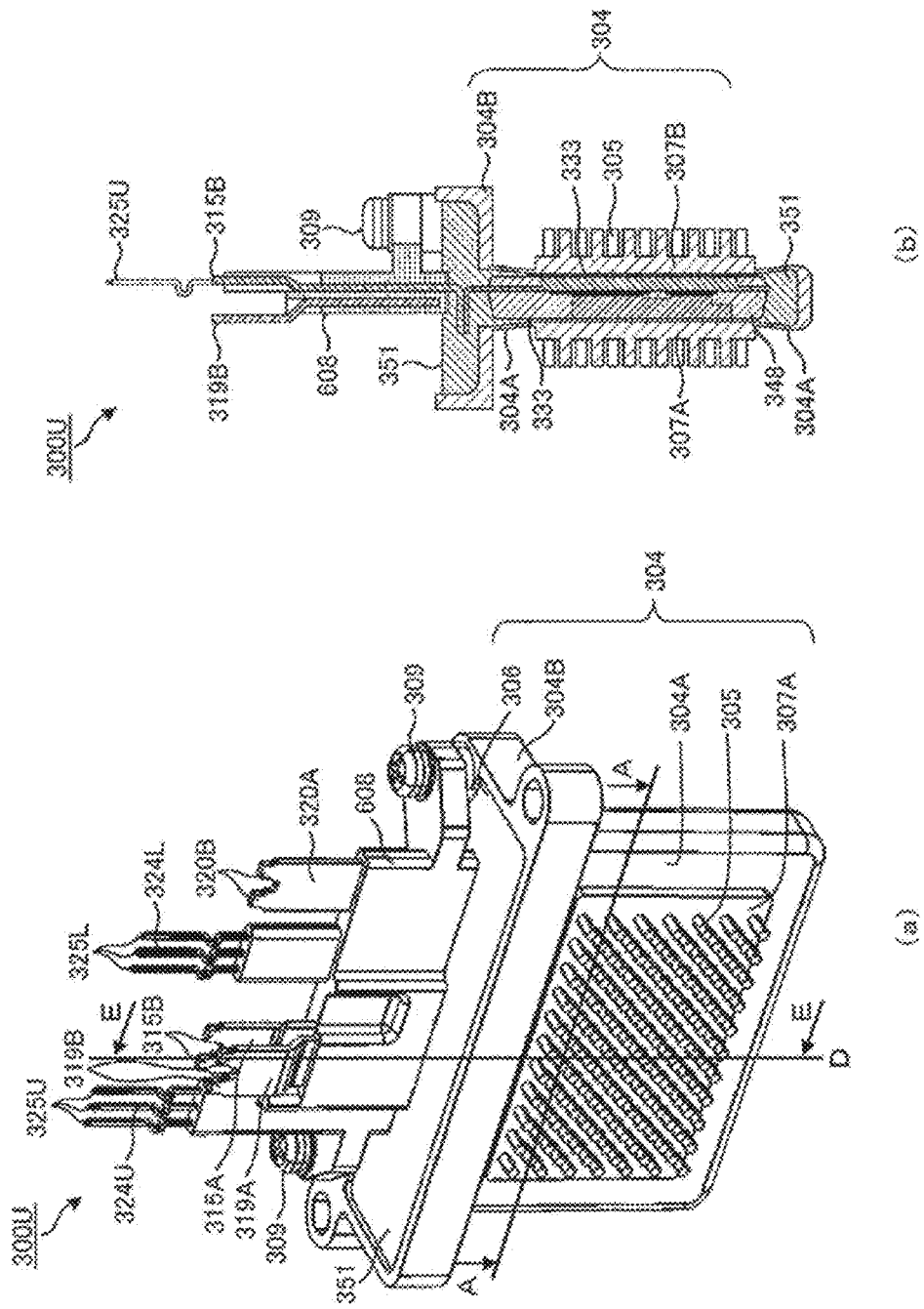
FIG. 12(a) is a perspective view of the power semiconductor module 300U of this embodiment.
FIG. 12(b) is a cross-sectional view of the power semiconductor module 300U of this embodiment, taken along the section plane D and seen from direction E.

Referring now to FIG. 12(a) through 16, the structures of the inverter circuit 140, and the power semiconductor modules 300U through 300W and the power semiconductor modules 301a through 301c used in the inverter circuit 140 are described in detail. The above described power semiconductor modules 300U through 300W and the power semiconductor modules 301a through 301c have the same structures, and therefore, the structure of the power semiconductor module 300U is now described as a typical example. In FIG. 12(a) through 16, signal terminals 325U correspond to the gate electrode 154 and the emitter electrode 155 disclosed in FIG. 2, and signal terminals 325L corresponds to the gate electrode 164 and the emitter electrode 165 disclosed in FIG. 2. DC positive terminals 315B are the same as the positive terminals 157 disclosed in FIG. 2, and DC negative terminals 319B are the same as the negative terminals 158 disclosed in FIG. 2. AC terminals 320B are the same as the AC terminals 159 disclosed in FIG. 2. FIG. 12(a) is a perspective view of the power semiconductor module 300U of this embodiment. FIG. 12(b) is a cross-sectional view of the power semiconductor module 300U of this embodiment, taken along the section plane D and seen from direction E.

Figure 13:
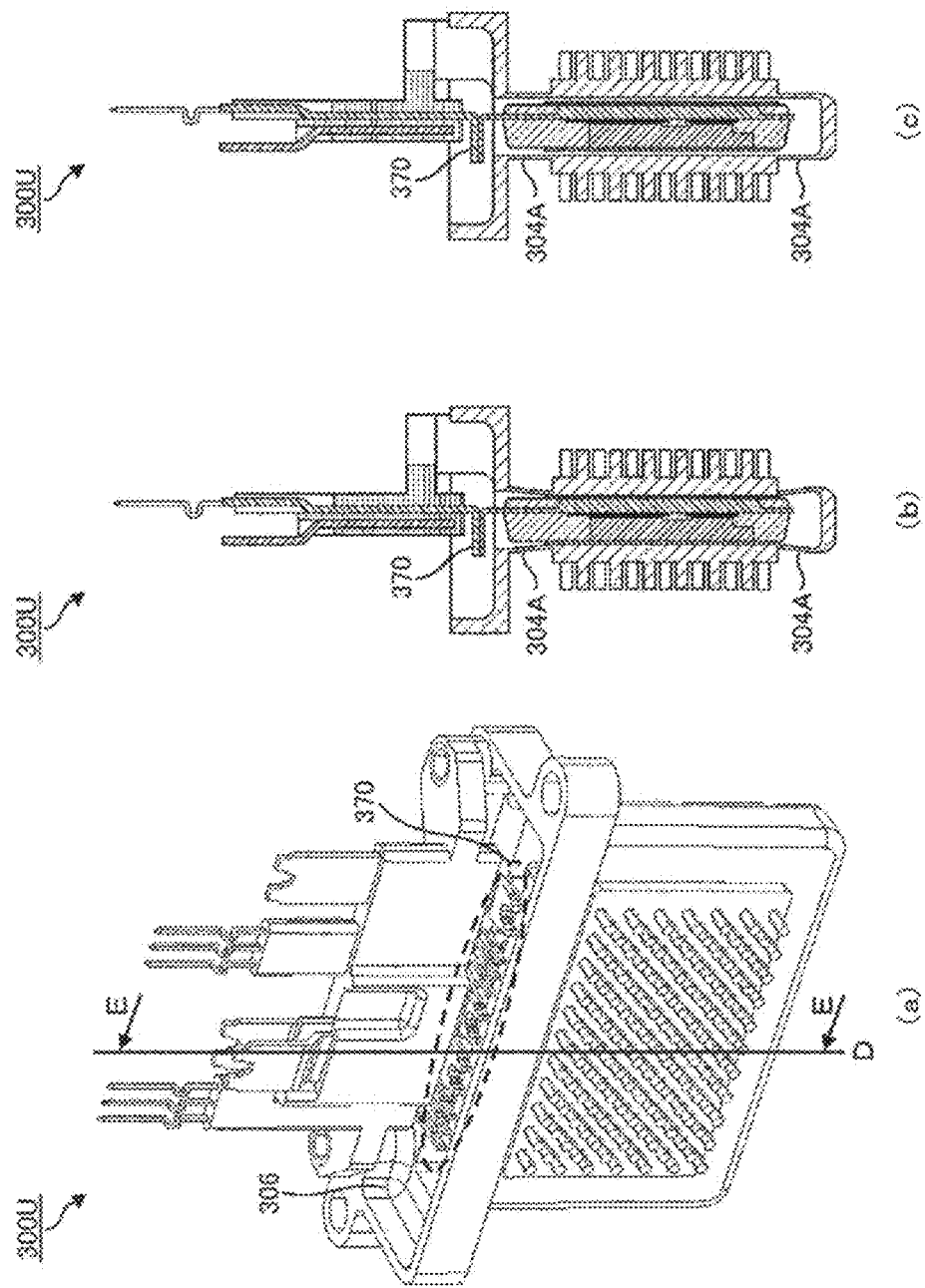
FIG. 13(a) is a perspective view.
FIG. 13(b) is a cross-sectional view that is taken along the section plane D and is seen from the direction E as in FIG. 12(b).
FIG. 13(c) is a diagram for explaining the process of inserting a primary module sealed unit 302.

FIG. 13(a) through 13(c) are diagrams showing the power semiconductor module 300U from which screws 309 and a second sealing resin 351 shown in FIGS. 12(a) and 12(b) are removed, for ease of comprehension. FIG. 13(a) is a perspective view, and FIG. 13(b) is a cross-sectional view that is taken along the section plane D and is seen from the direction E as in FIG. 12(b). FIG. 13 (c) is a diagram for explaining the process of inserting a primary module sealed unit 302.

With insulating members 333 being attached to both surfaces of the primary module sealed unit 302, the primary module sealed unit 302 is inserted into a housing space formed with the inner walls of a module case 304.

Figure 14:
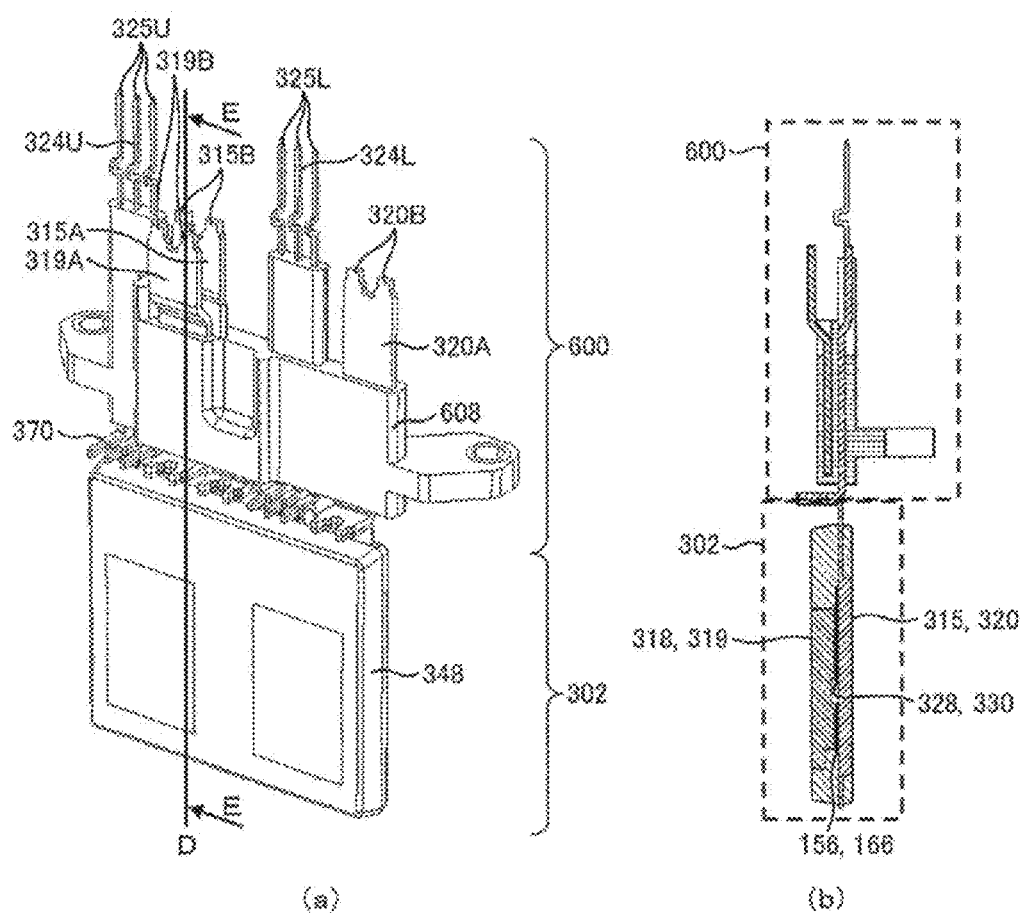
FIG. 14(a) is a perspective view.
FIG. 14(b) is a cross-sectional view that is taken along the section plane D and is seen from the direction E as in FIGS. 12(b) and 13(b).

FIG. 14 is a diagram showing the power semiconductor module 300U from which the module case 304 shown in FIG. 13 is further removed. FIG. 14(a) is a perspective view, and FIG. 14(b) is a cross-sectional view that is taken along the section plane D and is seen from the direction E as in FIGS. 12(b) and 13(b).

Figure 15:
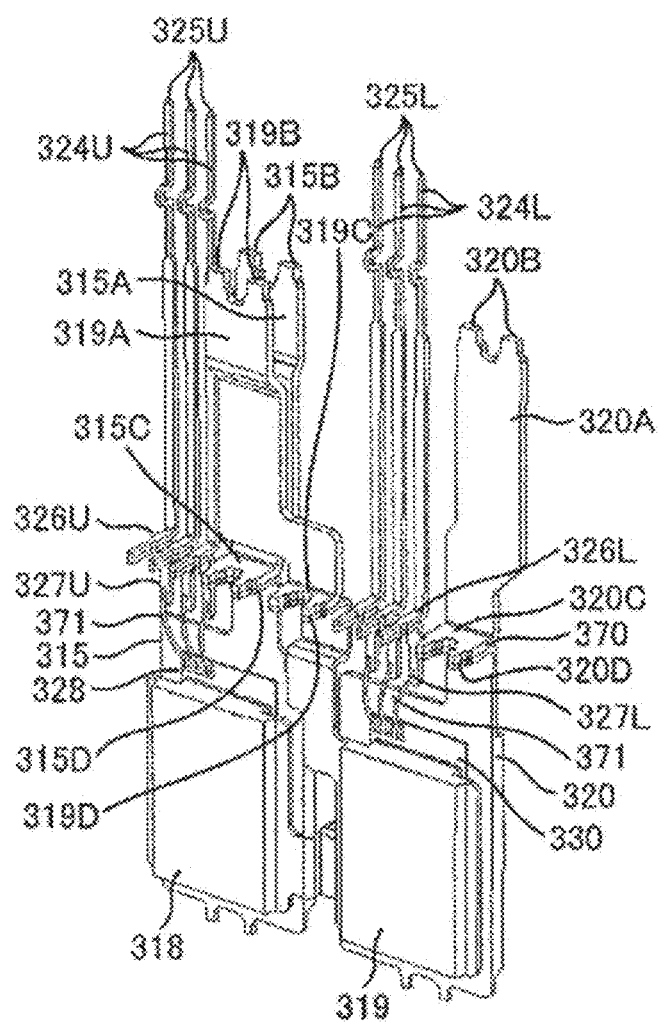
FIG. 15 is a perspective view of the power semiconductor module 300U from which a first sealing resin 348 and a wiring insulating portion 608 shown in FIG. 14 are removed.
Figure 16:
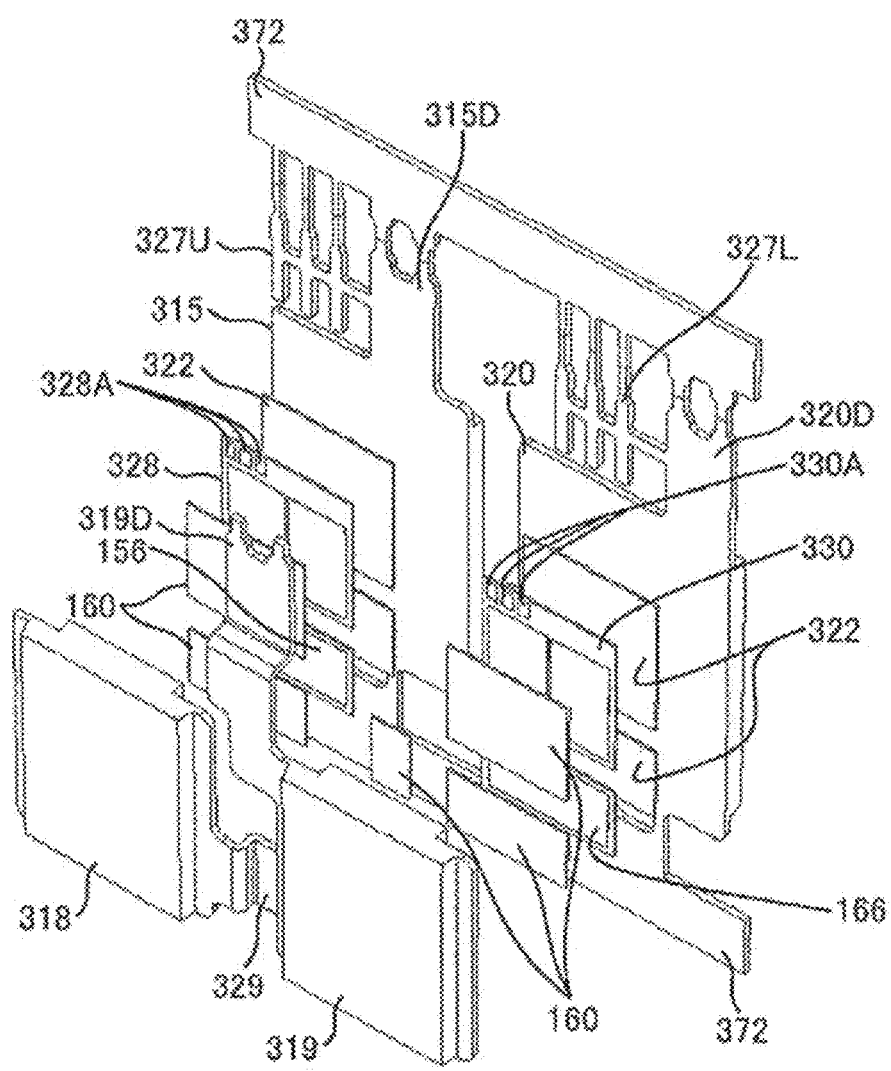
FIG. 16 is a diagram for explaining the process of assembling the primary module sealed unit 302.

FIG. 15 is a perspective view of the power semiconductor module 300U from which a first sealing resin 348 and a wiring insulating portion 608 shown in FIG. 14 are removed. FIG. 16 is a diagram for explaining the process of assembling the primary module sealed unit 302. The power semiconductor devices (the IGBT 328, the IGBT 330, the diode 156, and the diode 166) forming the series circuit 150 of the upper and lower arms are interposed and fixed between a conductor plate 315 and a conductor plate 318, or between a conductor plate 320 and a conductor plate 319, as shown in FIGS. 14(b) and 15. The conductor plate 315 and the like are sealed with the first sealing resin 348, with the heat releasing surfaces thereof being exposed. The insulating members 333 are bonded to the heat releasing surfaces with heat and pressure. As shown in FIG. 14(a), the first sealing resin 348 has the shape of a polyhedron (a rectangular parallelepiped in this case).

The primary module sealed unit 302 sealed with the first sealing resin 348 is inserted into the module case 304, and is bonded, with heat and pressure, to the inner surfaces of the module case 304 that is a can-type cooler, with the insulating members 333 being interposed therebetween. Here, a can-type cooler is a cooler that has a cylindrical shape having an insertion opening 306 at one side and a bottom at the other side. The voids remaining inside the module case 304 are filled with the second sealing resin 351.

The module case 304 is formed with a material having electrical conductivity, such as an aluminum alloy material (Al, AlSi, AlSiC, or Al—C), and is integrally molded into a seamless form. The module case 304 does not have any opening other than the insertion opening 306, and the insertion opening 306 has its outer periphery surrounded by a flange 304B. Also, as shown in FIG. 12(a), a first heat releasing member 307A and a second heat releasing member 307B that have larger areas than the other surfaces are placed to face each other, and the respective power semiconductor devices (the IGBT 328, the IGBT 330, the diode 156, and the diode 166) are placed to face the heat releasing surfaces. The three surfaces that connect the first heat releasing member 307A and the second heat releasing member 307B facing each other constitute a sealed surface with a smaller width than the first heat releasing member 307A and the second heat releasing member 307B, and the insertion opening 306 is formed in the remaining other surface. The shape of the module case 304 is not necessarily a precise rectangular parallelepiped, and may have rounded corners as shown in FIG. 12(a).

As a metallic case having such a shape is used, the seal against the refrigerant can be maintained with the flange 304B even though the module case 304 is inserted into the flow channel 19 in which the refrigerant such as water or oil is flowing. Accordingly, leakage of the cooling medium into the module case 304 can be prevented with a simple mechanism. Fins 305 are uniformly formed on the first heat releasing member 307A and the second heat releasing member 307B which face each other. A first joining member 304A having an extremely small thickness is formed on the outer peripheries of the first heat releasing member 307A and the second heat releasing member 307B. Since the first joining member 304A has such a reduced thickness as to be easily deformed when pressure is applied to the fins 305, productivity after the insertion of the primary module sealed unit 302 is increased.

With the first joining member 304A of the module case 304, which will be described in detail later with reference to FIG. 20 and the following drawings, the insulating members 333 can be prevented from being detached from the primary module sealed unit 302 and the module case 304. Particularly, in a case where the outer surfaces of the module case 304 are directly cooled by a cooling medium as in this embodiment, the thermal resistance of the heat conduction paths from the power semiconductor devices to the module case 304 is lowered, thereby to facilitate heat release from the outer surfaces of the module case 304. With that, the current to flow in the power semiconductor devices can be increased, and the cooling unit of the power conversion apparatus can be made smaller in size. Thus, the output current per volume in the power conversion apparatus can be dramatically increased.

As the conductor plate 315 and the like are bonded, with heat and pressure, to the inner walls of the module case 304 via the insulating members 333 as described above, voids between the inner walls of the module case 304 and the conductor plate 315 and the like can be reduced, and heat generated from the power semiconductor devices can be efficiently transferred to the fins 305. Furthermore, as the insulating members 333 each have a certain thickness and a certain degree of flexibility, thermal stress can be absorbed by the insulating members 333, and the power conversion apparatus can be suitably used in a vehicle with rapid temperature changes.

Outside the module case 304, a metallic DC positive wiring 315A and a metallic DC negative wiring 319A for electrically connecting to the capacitor module 500 are provided, and the DC positive terminals 315B (157) and the DC negative terminals 319B (158) are formed at the respective edge portions. A metallic AC wiring 320A for supplying AC power to the motor generator MG1 is also provided, and the AC terminals 320B (159) are formed at the edge portion thereof. In this embodiment, as shown in FIG. 15, the DC positive wiring 315A is connected to the conductor plate 315, the DC negative wiring 319A is connected to the conductor plate 319, and the AC wiring 320A is connected to the conductor plate 320.

Outside the module case 304, metallic signal wirings 324U and 324L for electrically connecting to the driver circuit 174 are further provided, and the signal terminals 325U (154 and 155) and the signal terminals 325L (164 and 165) are formed at the respective edge portions. In this embodiment, the signal wirings 324U are connected to the IGBT 328, and the signal wirings 324L are connected to the IGBT 330, as shown in FIG. 15.

The DC positive wiring 315A, the DC negative wiring 319A, the AC wiring 320A, the signal wirings 324U, and the signal wirings 324L are integrally molded as an auxiliary molded unit 600, while being insulated from one another by the wiring insulating portion 608 molded from a resin material. The wiring insulating portion 608 also functions as the supporting member for supporting the respective wirings, and the resin material that is suitably used here is a thermosetting resin or a thermoplastic resin having insulation properties. With that, the insulation among the DC positive wiring 315A, the DC negative wiring 319A, the AC wiring 320A, the signal wirings 324U, and the signal wirings 324L can be secured, and high-density wiring can be realized. The auxiliary molded unit 600 is metal-joined to the primary module sealed unit 302 via a connecting portion 370, and is then secured to the module case 304 with the screws 309 penetrating through screw holes formed in the wiring insulating portion 608. The metal joining between the primary module sealed unit 302 and the auxiliary molded unit 600 at the connecting portion 370 can be performed by TIG welding, for example.

The DC positive wiring 315A and the DC negative wiring 319A are stacked to face each other, with the wiring insulating portion 608 being interposed therebetween, and extend substantially parallel to each other. With this arrangement and shapes, the currents that instantly flow at the time of a power semiconductor device switching operation face each other and flow in opposite directions. With that, the magnetic fields generated from the currents cancel each other out, and this action leads to lower inductance. It should be noted that the AC wiring 320A and the signal terminals 325U and 325L extend in the same direction as the DC positive wiring 315A and the DC negative wiring 319A.

The connecting portion 370 at which the primary module sealed unit 302 and the auxiliary molded unit 600 are connected by metal joining is sealed in the module case 304 with the second sealing resin 351. With that, the insulation distance necessary between the connecting portion 370 and the module case 304 can be constantly secured. Accordingly, the size of the power semiconductor module 300U can be made smaller than in a case where the sealing is not performed.

As shown in FIG. 15, an auxiliary-module-side DC positive connection terminal 315C, an auxiliary-module-side DC negative connection terminal 319C, an auxiliary-module-side AC connection terminal 320C, auxiliary-module-side signal connection terminals 326U, and auxiliary-module-side signal connection terminals 326L are arranged in a line at the connecting portion 370 on the side of the auxiliary module 600. Meanwhile, on the side of the primary module sealed unit 302 of the connecting portion 370, device-side DC positive connection terminals 315D, device-side DC negative connection terminals 319D, device-side AC connection terminals 320D, device-side signal connection terminals 327U, and device-side signal connection terminals 327L are arranged in a line extending along a surface of the first sealing resin 348 having the shape of a polyhedron. As the respective terminals are aligned at the connecting portion 370, the primary module sealed unit 302 can be easily manufactured by transfer molding.

The positional relationships among the respective terminals regarded as independent terminals in accordance with the types of portions extending outward from the first sealing resin 348 of the primary module sealed unit 302 are now described. In the description below, the terminal formed with the DC positive wiring 315A (including the DC positive terminals 315B and the auxiliary-module-side DC positive connection terminal 315C) and the device-side DC positive connection terminals 315D will be referred to as a positive-side terminal, the terminal formed with the DC negative wiring 319A (including the DC negative terminals 319B and the auxiliary-module-side DC negative connection terminal 319C) and the device-side DC negative connection terminals 319D will be referred to as a negative-side terminal, the terminal formed with the AC wiring 320A (including the AC terminals 320B and the auxiliary-module-side AC connection terminal 320C) and the device-side AC connection terminals 320D will be referred to as an output terminal, the terminal formed with the signal wirings 324U (including the signal terminals 325U and the auxiliary-module-side signal connection terminals 326U) and the device-side signal connection terminals 327U will be referred to as an upper-arm signal terminal, and the terminal formed with the signal wirings 324L (including the signal terminals 325L and the auxiliary-module-side signal connection terminals 326L) and the device-side signal connection terminals 327L will be referred to as a lower-arm signal terminal.

The above described respective terminals protrude from the first sealing resin 348 and the second sealing resin 351 through the connecting portion 370, and the respective portions (the device-side DC positive connection terminals 315D, the device-side DC negative connection terminals 319D, the device-side AC connection terminals 320D, the device-side signal connection terminals 327U, and the device-side signal connection terminals 327L) protruding from the first sealing resin 348 are arranged in a row extending along one surface of the first sealing resin 348 having the shape of a polyhedron as described above. The positive-side terminal and the negative-side terminal in a stacked state protrude from the second sealing resin 351, and extend outward from the module case 304. With this structure, application of excess stress to the power semiconductor devices and the portions connected to the terminals can be prevented, and formation of voids in the metal mold can also be prevented, when mold clamping is performed while the primary module sealed unit 302 is manufactured by sealing the power semiconductor devices with the first sealing resin 348. Also, the currents in the positive-side terminal and the negative-side terminal in a stacked state flow in opposite directions, and generate magnetic fluxes in such directions as to cancel out each other. Accordingly, lower inductance can be realized.

On the side of the auxiliary module 600, the auxiliary-module-side DC positive connection terminal 315C and the auxiliary-module-side DC negative connection terminal 319C are formed at the respective edge portions of the DC positive wiring 315A and the DC negative wiring 319A on the opposite side from the DC positive terminals 315B and the DC negative terminals 319B. The auxiliary-module-side AC connection terminal 320C is formed at the edge portion of the AC wiring 320A on the opposite side from the AC terminals 320B. The auxiliary-module-side signal connection terminals 326U and 326L are formed at the respective edge portions of the signal wirings 324U and 324L on the opposite side from the signal terminals 325U and 325L.

Figure 17:
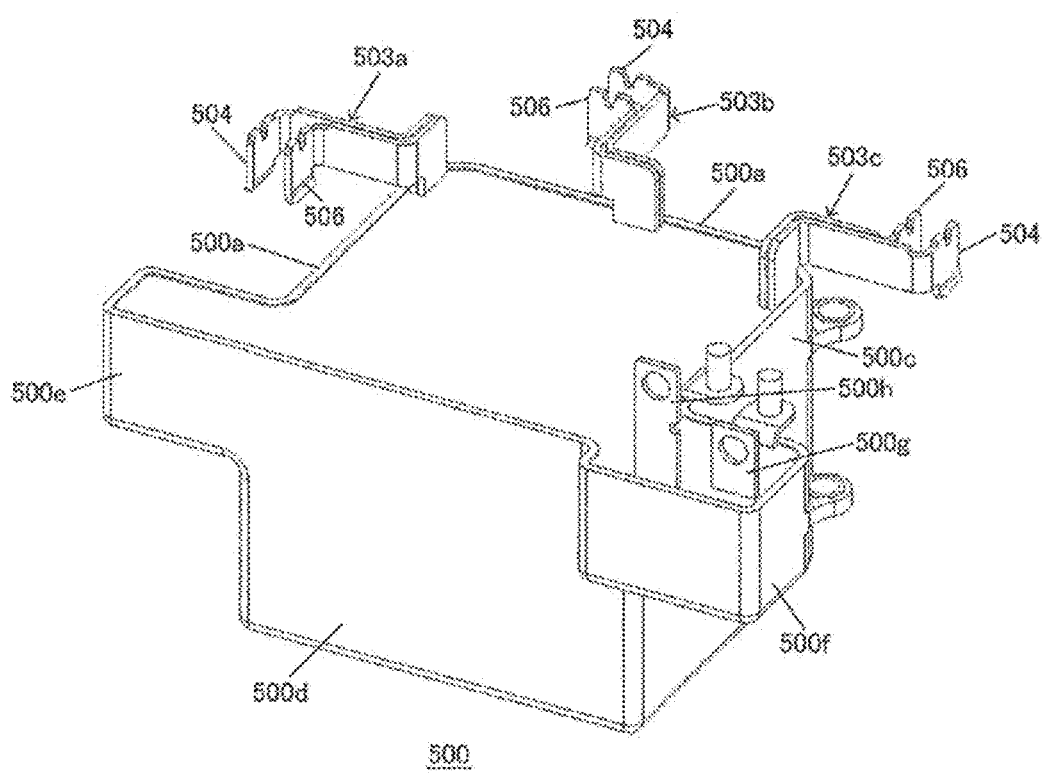
FIG. 17 is an external perspective view of the capacitor module 500.

Meanwhile, on the side of the primary module sealed unit 302, the device-side DC positive connection terminals 315D, the device-side DC negative connection terminal 319D, and the device-side AC connection terminals 320D are formed on the conductor plates 315, 319, and 320, respectively. The device-side signal connection terminals 327U and 327L are connected to the IGBTs 328 and 330, respectively, by bonding wires 371. FIG. 17 is an external perspective view of the capacitor module 500. Capacitor cells are placed in the capacitor module 500. On the upper surface of the capacitor module 500, capacitor terminals 503a through 503c are formed to protrude in the vicinity of the surface of the capacitor module 500 facing the flow channel 19. The capacitor terminals 503a through 503c are formed to correspond to the positive terminals 157 and the negative terminals 158 of the respective power semiconductor modules 300. The capacitor terminals 503a through 503c have the same shapes, and insulating sheets are provided between the negative-side capacitor terminals 504 and the positive-side capacitor terminals 506 of the respective capacitor terminals 503a through 503c. In this manner, insulation between the terminals is secured.

Protruding portions 500e and 500f are formed at upper portions on the side of a side surface 500d of the capacitor module 500. A discharge resistor is mounted in the protruding portion 500e, and a Y-capacitor against common mode noise is mounted in the protruding portion 500f. The supply terminals 508 and 509 shown in FIG. 5 are attached to terminals 500g and 500h protruding from the upper surface of the protruding portion 500f. As shown in FIG. 10, the concave portions 405a and 405b are formed between the openings 402b and 402c and the side surface 12d. As the capacitor module 500 is housed in the housing space 405 of the flow channel forming unit 12, the protruding portion 500e is housed in the concave portion 405a, and the protruding portion 500f is housed in the concave portion 405b.

The discharge resistor mounted in the protruding portion 500e is a resistor for discharging charges stored in the capacitor cells in the capacitor module 500 when the inverter is stopped. The concave portion 405a housing the protruding portion 500e is formed immediately above the flow channel of the refrigerant flowing in through the inlet pipe 13. Accordingly, the temperature rise in the discharge resistor at the time of discharging can be reduced.

Figure 18:
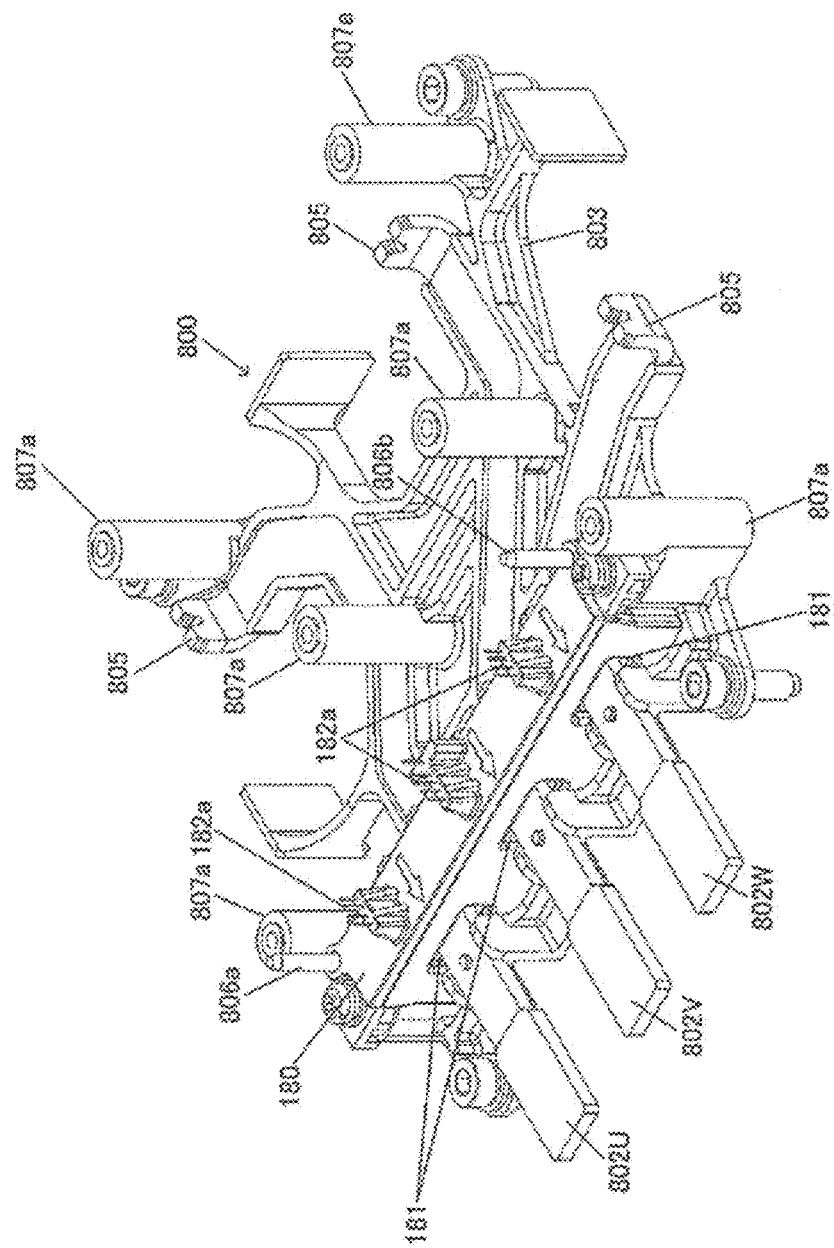
FIG. 18 is a perspective view of the bus bar assembly 800.

FIG. 18 is a perspective view of the bus bar assembly 800. The bus bar assembly 800 includes the U-, V-, and W-phase AC bus bars 802U, 802V, and 802W, a holding member 803 for holding and securing the AC bus bars 802U through 802W, and the current sensor 180 for detecting alternating current flowing in the AC bus bars 802U through 802W. Each of the AC bus bars 802U through 802W is formed with a wide conductor. On the holding member 803 made of an insulating material such as resin, supporting members 807a for holding the driver circuit board 22 are formed to protrude upward from the holding member 803.

The current sensor 180 is placed on the bus bar assembly 800 so as to be parallel to the side surface 12d in a position close to the side surface 12d of the flow channel forming unit 12 when the bus bar assembly 800 is secured onto the flow channel forming unit 12 as shown in FIG. 8. Through holes 181 for allowing the AC bus bars 802U through 802W to penetrate threrethrough are formed in the side surfaces of the current sensor 180. Sensor elements are provided at the portions where the through holes 181 are formed in the current sensor 180, and signal lines 182a of the respective sensor elements protrudes from the upper surface of the current sensor 180. The sensor elements are aligned in the extending direction of the current sensor 180 or in the extending direction of the side surface 12d of the flow channel forming unit 12. The AC bus bars 802U through 802W penetrate through the respective through holes 181, and the end portions thereof protrude parallel to each other.

As shown in FIG. 18, positioning protruding portions 806a and 806b are formed to protrude upward from the holding member 803. The current sensor 180 is secured onto the holding member 803 with screws. At this point, the protruding portions 806a and 806b are engaged with positioning holes formed in the frame of the current sensor 180, to position the current sensor 180. Furthermore, when the driver circuit board 22 is secured to the supporting members 807a, the positioning protruding portions 806a and 806b are engaged with positioning holes formed in the driver circuit board 22, to position the signal lines 182a of the current sensor 180 into the through holes of the driver circuit board 22. The signal lines 182a are joined to the wiring pattern of the driver circuit board 22 with solder.

In this embodiment, the holding member 803, the supporting members 807a, and the protruding portions 806a and 806b are integrally formed with resin. As the holding member 803 has the function to position the current sensor 180 and the driver circuit board 22 as described above, the assembling and solder connecting operations between the signal lines 182a and the driver circuit board 22 become easier. Also, as the holding member 803 has the mechanism to hold the current sensor 180 and the driver circuit board 22, the number of components in the entire power conversion apparatus can be reduced.

The AC bus bars 802U through 802W are secured to the holding member 803 so that the wide surfaces become horizontal, and connecting portions 805 to be connected to the AC terminals 159 of the power semiconductor modules 300U through 300W stand vertically. The connecting portions 805 have concave-convex portions at the end portions, and heat concentrates on the concave-convex portions at the time of welding.

Since the current sensor 180 extends parallel to the side surface 12d of the flow channel forming unit 12 as described above, the AC bus bars 802U through 802W penetrating through the through holes 181 of the current sensor 180 are placed on the side surface 12d of the flow channel forming unit 12. As the respective power semiconductor modules 300U through 300W are placed in the flow channel zones 19a, 19b, and 19c formed along the side surfaces 12a, 12b, and 12c of the flow channel forming unit 12, the connecting portions 805 of the AC bus bars 802U through 802W are placed in positions corresponding to the side surfaces 12a through 12c in the bus bar assembly 800. As a result, the U-phase AC bus bar 802U extends from the power semiconductor module 300U located in the vicinity of the side surface 12b to the side surface 12d, the V-phase AC bus bar 802V extends from the power semiconductor module 300V located in the vicinity of the side surface 12a to the side surface 12d, and the W-phase AC bus bar 802W extends from the power semiconductor module 300W located in the vicinity of the side surface 12c to the side surface 12d, as shown in FIG. 8.

Figure 19:
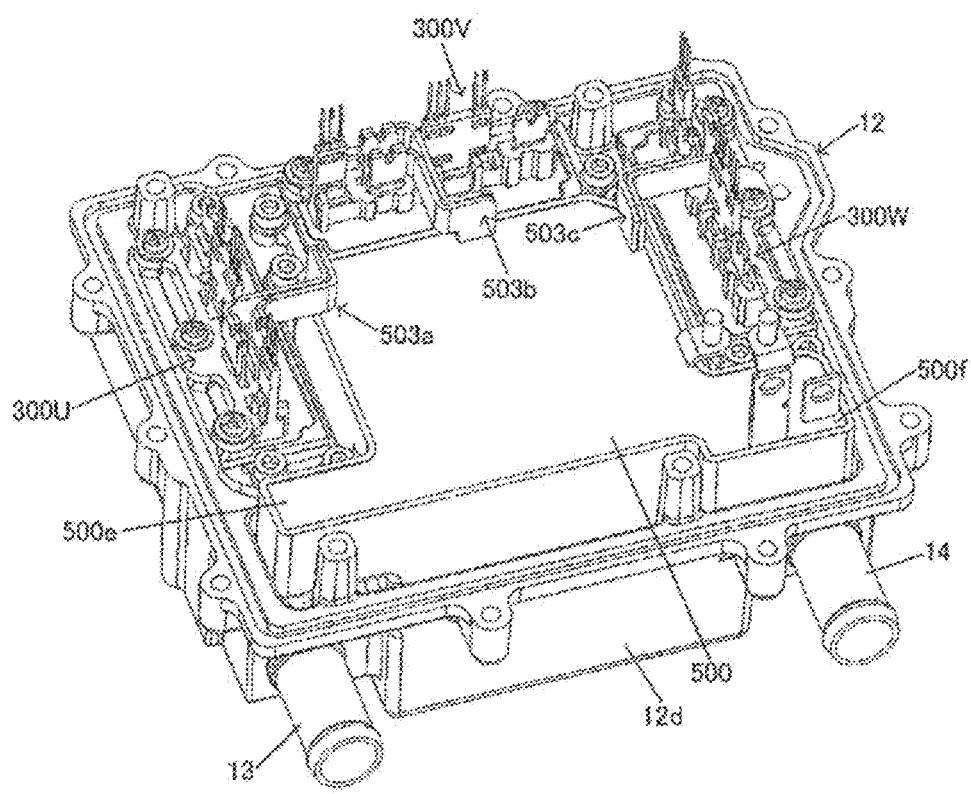
FIG. 19 is a diagram showing the flow channel forming unit 12 that has the power semiconductor modules 300U through 300W secured in openings 402a through 402c, and has the capacitor module 500 housed in housing space 405.

FIG. 19 is a diagram showing the flow channel forming unit 12 that has the power semiconductor modules 300U through 300W secured in the openings 402a through 402c, and has the capacitor module 500 housed in the housing space 405. In the example shown in FIG. 19, the U-phase power semiconductor module 300U is secured in the opening 402b, the V-phase power semiconductor module 300V is secured in the opening 402a, and the W-phase power semiconductor module 300W is secured in the opening 402c. After that, the capacitor module 500 is housed in the housing space 405, and the terminals on the capacitor side and the terminals of the respective power semiconductor modules are connected by welding or the like. The respective terminals protrude from the upper end surface of the flow channel forming unit 12, and a welding machine is brought closer from above to perform a welding operation.

The DC positive terminals 315B and the DC negative terminals 319B of the respective power semiconductor modules 300U through 300W arranged in a U shape are connected to the capacitor terminals 503a through 503c protruding from the upper surface of the capacitor module 500 as shown in FIG. 17. As the three power semiconductor modules 300U through 300W are arranged to surround the capacitor module 500, the positional relationships of the respective power semiconductor modules 300U through 300W with respect to the capacitor module 500 are substantially the same, and accordingly, the power semiconductor modules 300U through 300W can be connected to the capacitor module 500 in a balanced manner with the use of the capacitor terminals 503a through 503c of the identical shape. Thus, the circuit constants of the capacitor module 500 and the power semiconductor modules 300U through 300W can be easily balanced in the three phases, and current can easily flow in and out.

The above description is a mere example, and the present invention is not limited to the structures of the above described embodiment.

Figure 20:
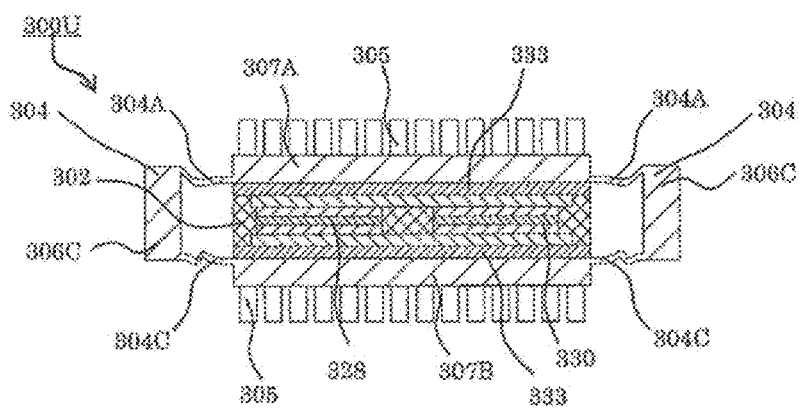
FIG. 20 is a cross-sectional view of the power semiconductor module 300U, taken along the A-A section plane and seen from the direction indicated by arrows in FIG. 12(a).

FIG. 20 is a cross-sectional view of the power semiconductor module 300U, taken along the A-A section plane and seen from the direction indicated by arrows in FIG. 12(a).

The adhesive insulating members 333 may be thin insulating sheets formed by mixing thermally-conductive filler with epoxy resin. As the sheet-like form is used, a thickness can be precisely determined, compared with grease or adhesive agent. Also, generation of voids can be reduced, and variations in thermal resistance and insulation performance can be dramatically reduced. Each of the insulating members 333 may be a ceramic plate or a bonding board formed by applying an adhesive material to both surfaces of a ceramic plate. As the adhesive insulating members 333 are bonded to the module case 304, both surfaces of the primary module sealed unit 302 can be cooled via the two members of the first heat releasing member 307A and the second heat releasing member 307B, and the heat releasing areas can be made larger. Accordingly, the heat releasing path that extends from both sides of the power semiconductor module 300U and excels in heat releasing properties can be formed, and the apparatus can be made smaller in size.

So as to prevent decreases in the heat conductivity of the heat conduction paths extending from the primary module sealed unit 302 to the module case 304, the adhesion between the primary module sealed unit 302 and the inner walls of the module case 304 needs to be improved, and detachment of the primary module sealed unit 302 from the inner walls of the module case 304 needs to be restrained. The principles in this aspect are described below.

The first joining member 304A is formed to surround the first heat releasing member 307A forming a heat releasing surface, and is connected to a sidewall portion 306C. Likewise, a second joining member 304C is formed to surround the second heat releasing member 307B forming a heat releasing surface, and is connected to a sidewall portion 306C.

The second joining member 304C functions as a plate spring portion that generates the pressing force for generating compressive stress in the direction in which the primary module sealed unit 302 is placed. The first joining member 304A functions as an adjustment portion that is deformed to adjust elastic deformation (the pressing force) of the plate spring of the second joining member 304C.

The rigidities of the second joining member 304C functioning as the plate spring portion and the first joining member 304A functioning to adjust elastic deformation as an adjustment portion are designed to be lower than the rigidities of the first heat releasing member 307A and the second heat releasing member 307B. For example, in this embodiment, the thicknesses of the first joining member 304A and the second joining member 304C are made smaller than the thicknesses of the first heat releasing member 307A and the second heat releasing member 307B, and the materials of the first joining member 304A and the second joining member 304C are made to have lower rigidities than the rigidities of the materials of the first heat releasing member 307A and the second heat releasing member 307B. Accordingly, when pressure is applied to both surfaces of the primary module sealed unit 302, the first joining member 304A and the second joining member 304C can be easily deformed by a load that is much smaller than a load that breaks the power semiconductor devices (the IGBTs 328 and 330, and the diodes 156 and 166).

FIGS. 23 through 27 are enlarged views of the joining members shown in FIG. 20. However, the fins 305 are not shown.

The connecting portion between the sidewall portion 306C and the first joining member 304A is defined as a second connecting portion C2, and the connecting portion between the first heat releasing member 307A and the first joining member 304A is defined as a first connecting portion C1. Further, the portion length of the first joining member 304A located between the first connecting portion C1 and the second connecting portion C2 is defined as an adjustment portion length L1. Likewise, the connecting portion between the sidewall portion 306C and the second joining member 304C is defined as a fourth connecting portion C4, and the connecting portion between the second heat releasing member 307C and the second joining member 304C is defined as a third connecting portion C3. Further, the portion length of the second joining member 304C located between the third connecting portion C3 and the fourth connecting portion C4 is defined as a plate spring portion length L2. The plate spring portion length L2 and the adjustment portion length L1 are lengths measured along curved portions.

As shown in FIGS. 23 through 27, in this embodiment, the length L2 of the portion of the second joining member 304C functioning as a plate spring is greater than the length L1 of the convex portion of the first joining member 304A functioning as the adjustment portion.

Figure 21:
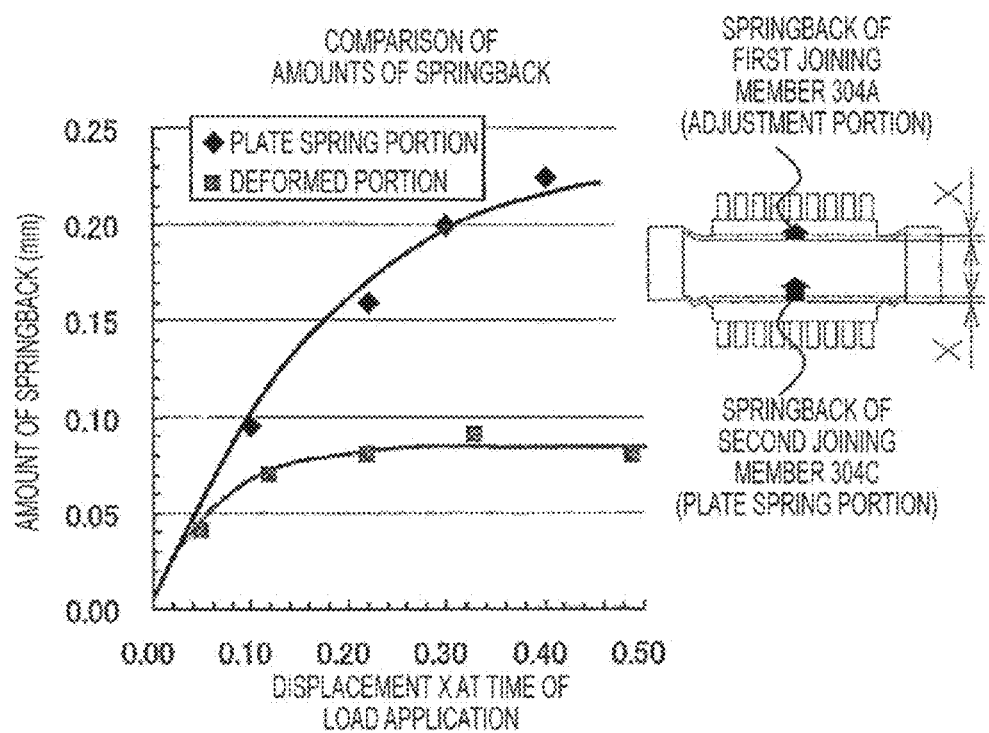
FIG. 21 shows a graph of amounts of springback measured when a first joining member 304A (an adjustment portion) and a second joining member 304C (a plate spring portion) were equally displaced.

FIG. 21 shows a graph of amounts of springback measured when the first joining member 304A (the adjustment portion) and the second joining member 304C (the plate spring portion) were equally displaced. This graph shows the results of an experiment in which the adjustment portion length L1 was six times greater than the thickness of the adjustment portion, and the plate spring portion length L2 was 1.4 times greater than the adjustment portion length L1. A load is applied to the first heat releasing member 307A, a displacement X is applied in the direction from the first heat releasing member 307A toward the second heat releasing member 307B, and the amounts of springback are measured with a test indicator at time of unloading.

Likewise, the amounts of springback were measured with the test indicator when the second heat releasing member 307B is displaced in the direction from the first heat releasing member 307A toward the second heat releasing member 307B, and the results were plotted.

Since the plate spring portion length L2 is greater than the adjustment portion length L1, the yield stress of the second joining member 304C (the plate spring portion) is higher than that of the first joining member 304A (the adjustment portion), and the elastic limit becomes higher. Therefore, when the displacement X under load is 0.06 mm or greater, the amount of springback of the second joining member 304C (the plate spring portion) is 1.1 times or more larger than the amount of springback of the first joining member 304A (the adjustment portion). If the primary module sealed unit 302 having the insulating members 333 attached to both surfaces is inserted in this region, and the first heat releasing member 307A and the second heat releasing member 307B are displaced in the direction from the first heat releasing member 307A toward the second heat releasing member 307B, the amount of springback of the second joining member 304C (the plate spring portion) is larger than that of the first joining member 304A (the adjustment portion). As a result, residual compressive stress is generated in the primary module sealed unit 302.

That is, the first joining member 304A (the adjustment portion) springs back away from the primary module sealed unit 302, but the second joining member 304C (the plate spring portion) springs back toward the primary module sealed unit 302 more than that of the first joining member 304A (the adjustment portion). Accordingly, in the primary module sealed unit 302, compressive stress can be generated from the difference in the amount of springback.

Figure 22:
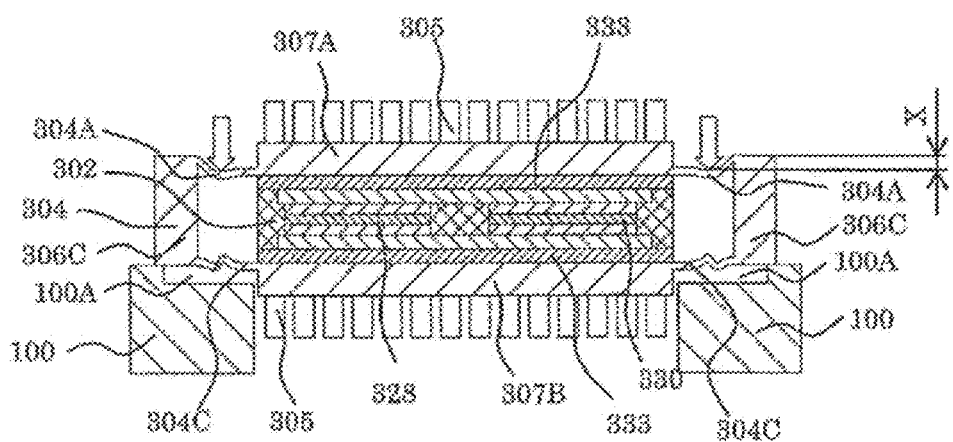
FIG. 22 is a diagram for explaining a method of adjusting a plate spring force.

FIG. 22 is a diagram for explaining a method of adjusting a plate spring force. The sidewall portions 306C of the module case 304 are placed on a cradle 100, and the portions of the first joining member 304A (the adjustment portion) located around the first heat releasing member 307A are pressed in the direction indicated by arrows. At this point, the load is transferred to the side of the second heat releasing member 307B via the primary module sealed unit 302, and the second joining member 304C (the plate spring portion) is displaced. When unloading is performed after the displacement reaches the residual stress generation region shown in FIG. 21, the amount of springback of the second joining member 304C (the plate spring portion) becomes larger than that of the first joining member 304A (the adjustment portion). As a result, residual compressive stress is generated in the primary module sealed unit 302.

At this point, the height X of the steps of the first joining member 304A (the adjustment portion) is adjusted, so that the plate spring force can be adjusted, and residual compressive stress can be made higher or lower. That is, as shown in FIG. 21, as the displacement X of the first joining member 304A (the adjustment portion) becomes larger, the difference in the amount of springback between the second joining member 304C (the plate spring portion) and the first joining member 304A (the adjustment portion) becomes larger, and residual compressive stress also become higher.

As cut portions 100A are formed in part of the cradle 100, the second joining member 304C (the plate spring portion) can be deformed in a convex fashion in the opposite direction from the primary module sealed unit 302 when the thinner portions around the first heat releasing member 307A are pressed. Accordingly, the height X of the steps of the first joining member 304A (the adjustment portion) can be made larger.

Instead of the thinner portions around the first heat releasing member 307A, upper portions of the fins 305 may be pressed with a jig or the like.

Figure 23:
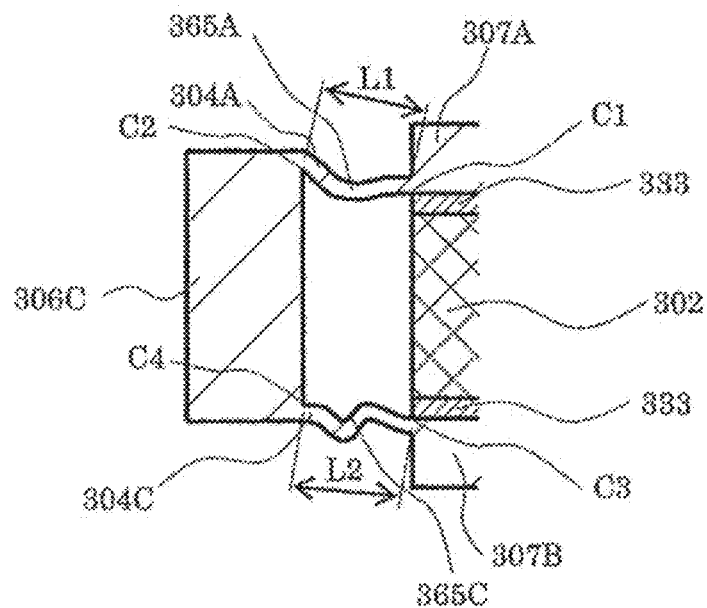
FIG. 23 is an enlarged view (Example 1) of the joining members shown in FIG. 20.
Figure 24:
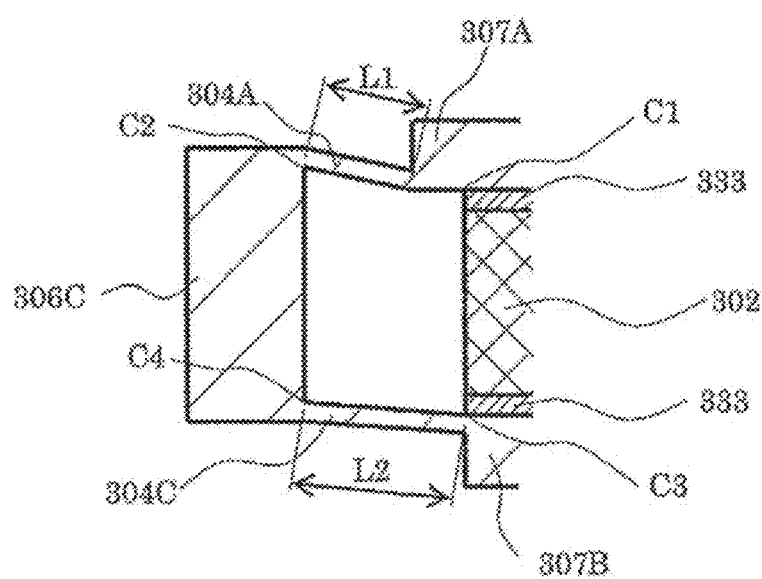
FIG. 24 is an enlarged view (Example 2) of the joining members shown in FIG. 20.
Figure 25:
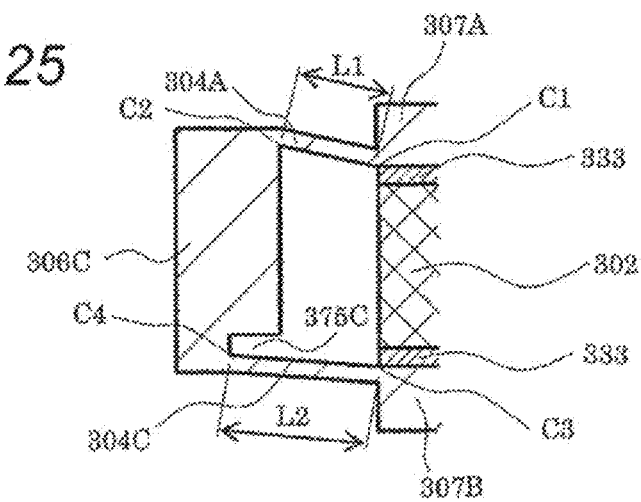
FIG. 25 is an enlarged view (Example 3) of the joining members shown in FIG. 20.

In the following, the respective examples shown in FIGS. 23 through 25 are described. FIG. 23 is an enlarged view (Example 1) of the joining members shown in FIG. 20. A first curved portion 365A is formed in the first joining member 304A (the adjustment portion), and a second curved portion 365C is formed in the second joining member 304C (the plate spring portion). The first curved portion 365A and the second curved portion 365C can be formed by pressing or the like at low costs. As the first curved portion 365A is formed in the first joining member 304A (the adjustment portion), and a second curved portion 365C is formed in the second joining member 304C (the plate spring portion), the ratio between the plate spring portion length L2 and the adjustment portion length L1 can be arbitrarily set.

With this arrangement, the plate spring portion length L2 can be made greater than the adjustment portion length L1, and the amount of springback of the second joining member 304C (the plate spring portion) becomes larger than the amount of springback of the first joining member 304A (the adjustment portion) when the first heat releasing member 307A and the second heat releasing member 307B are displaced in the direction from the first heat releasing member 307A toward the second heat releasing member 307B. Accordingly, residual compressive stress is generated in the primary module sealed unit 302. It should be noted that the first curved portion 365A may be designed to have a linear shape.

FIG. 24 is an enlarged view (Example 2) of the joining members shown in FIG. 20. The size of the second heat releasing member 307B is made smaller than that of the first heat releasing member 307A, and the width of the second joining member 304C (the plate spring portion) is made greater than that of the first joining member 304A (the adjustment portion). That is, the second heat releasing member 307B is designed so that the projective portion of the second heat releasing member 307B becomes smaller than the projective portion of the first heat releasing member 307A when projected from a direction perpendicular to the facing surface of the first heat releasing member 307A facing the primary module sealed unit 302.

With this arrangement, the plate spring portion length L2 can be made greater than the adjustment portion length L1, and the amount of springback of the second joining member 304C (the plate spring portion) becomes larger than the amount of springback of the first joining member 304A (the adjustment portion) when the first heat releasing member 307A and the second heat releasing member 307B are displaced in the direction from the first heat releasing member 307A toward the second heat releasing member 307B. Accordingly, residual compressive stress is generated in the primary module sealed unit 302.

FIG. 25 is an enlarged view (Example 3) of the joining members shown in FIG. 20. A slit-like or tapered groove portion 375C is formed on the side of the sidewall portion 306C connected to the second joining member 304C (the plate spring portion). With this arrangement, the plate spring portion length L2 can be made greater than the adjustment portion length L1, and the amount of springback of the second joining member 304C (the plate spring portion) becomes larger than the amount of springback of the first joining member 304A (the adjustment portion) when the first heat releasing member 307A and the second heat releasing member 307B are displaced in the direction from the first heat releasing member 307A toward the second heat releasing member 307B. Accordingly, residual compressive stress is generated in the primary module sealed unit 302.

Figure 26:
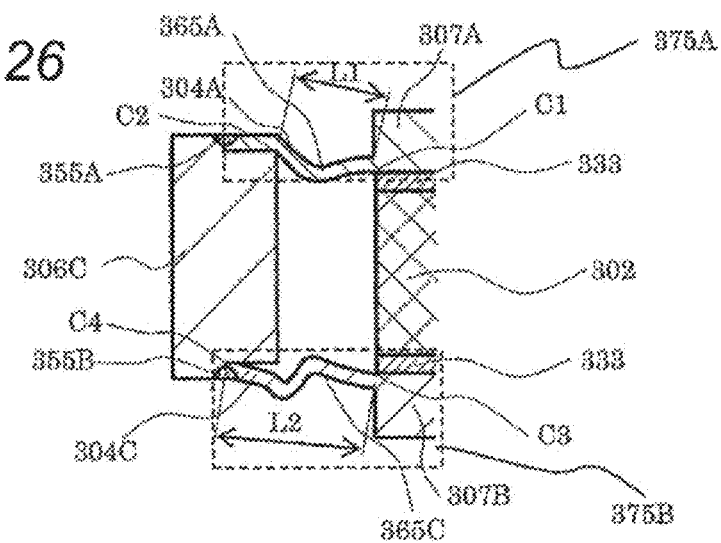
FIG. 26 is an enlarged view (Example 4) of the joining members shown in FIG. 20.
Figure 27:
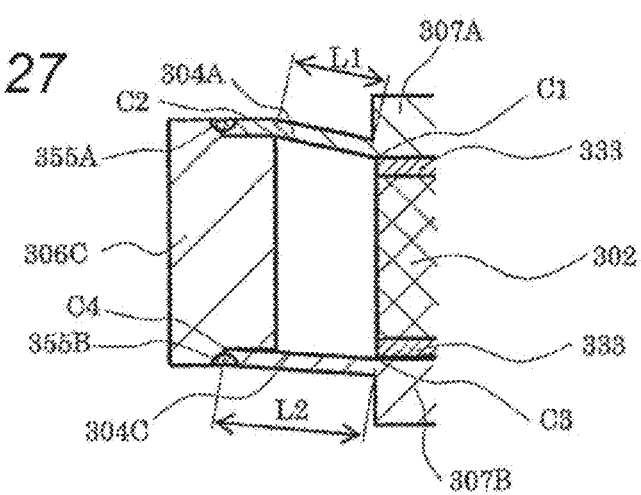
FIG. 27 is an enlarged view (Example 5) of the joining members shown in FIG. 20.

While the module case 304 is integrally formed in each of the above Examples, FIGS. 26 and 27 show examples in which the sidewall portion 306C is formed separately. FIG. 26 is an enlarged view (Example 4) of the joining members shown in FIG. 20.

The module case 304 is formed with a total of three members: a first member 375A formed with the first heat releasing member 307A and the first joining member 304A (the adjustment portion), a second member 375B formed with the second heat releasing member 307B and the second joining member 304C (the plate spring portion), and the sidewall portion 306C.

The first member 375A and the sidewall portion 306C, and the second member 375B and the sidewall portion 306C are bonded by laser welding or friction stir welding. The joining portion between the first member 375A and the sidewall portion 306C is a first joining portion 355A, and the joining portion between the second member 375B and the sidewall portion 306C is a second joining portion 355B.

The first joining member 304A has a convex shape bulging toward the primary module sealed unit 302, and the second joining member 304C has a convex shape bulging toward the opposite side from the primary module sealed unit 302. With those three members, each of the inner surfaces of the first heat releasing member 307A and the second heat releasing member 307B (the portions to be in contact with the primary module sealed unit 302) is finished with high precision to increase flatness and reduce surface roughness, and is then jointed to the sidewall portion 306C. Accordingly, the adhesion of the first heat releasing member 307A and the second heat releasing member 307B to the insulating members 333 can be improved.

When the second heat releasing member 307B is displaced in the direction from the first heat releasing member 307A toward the second heat releasing member 307B, the second joining member 304C (the plate spring portion) is deformed with the second joining portion 355B being the starting point, and therefore, approaches the fourth connecting portion C4. When the first heat releasing member 307A is displaced in the direction from the first heat releasing member 307A toward the second heat releasing member 307B, the first joining member 304A (the adjustment portion) is deformed with the inner wall of the sidewall portion 306C being the starting point, and therefore, approaches the second connecting portion C2. Accordingly, the plate spring portion length L2 can be made greater than the adjustment portion length L1 at low costs, without a change in heat releasing portion size or formation of a groove portion.

With this arrangement, the plate spring portion length L2 can be made greater than the adjustment portion length L1, and the amount of springback of the second joining member 304C (the plate spring portion) becomes larger than the amount of springback of the first joining member 304A (the adjustment portion) when the first heat releasing member 307A and the second heat releasing member 307B are displaced in the direction from the first heat releasing member 307A toward the second heat releasing member 307B. Accordingly, residual compressive stress is generated in the primary module sealed unit 302.

FIG. 27 is an enlarged view (Example 5) of the joining members shown in FIG. 20. When the second heat releasing member 307B is displaced in the direction from the first heat releasing member 307A toward the second heat releasing member 307B, the second joining member 304C (the plate spring portion) is deformed with the second joining portion 355B being the starting point, and therefore, approaches the fourth connecting portion C4. When the first heat releasing member 307A is displaced in the direction from the first heat releasing member 307A toward the second heat releasing member 307B, the first joining member 304A (the adjustment portion) is deformed with the inner wall of the sidewall portion 306C being the starting point, and therefore, approaches the second connecting portion C2. Accordingly, the plate spring portion length L2 can be made greater than the adjustment portion length L1 at low costs, without a change in heat releasing portion size or formation of a groove portion.

Furthermore, as the first curved portion 365A is formed in the first joining member 304A (the adjustment portion), and a second curved portion 365C is formed in the second joining member 304C (the plate spring portion), the ratio between the plate spring portion length L2 and the adjustment portion length L1 can be arbitrarily set.

With this arrangement, the plate spring portion length L2 can be made greater than the adjustment portion length L1, and the amount of springback of the second joining member 304C (the plate spring portion) becomes larger than the amount of springback of the first joining member 304A (the adjustment portion) when the first heat releasing member 307A and the second heat releasing member 307B are displaced in the direction from the first heat releasing member 307A toward the second heat releasing member 307B. Accordingly, residual compressive stress is generated in the primary module sealed unit 302. It should be noted that the first curved portion 365A may be designed to have a linear shape.

The second joining member 304C (the plate spring portion) and the first joining member 304A (the adjustment portion) are made of the same material in this embodiment, but may use different materials having different elastic limits, so as to create a difference in the amount of springback.

Figure 28:
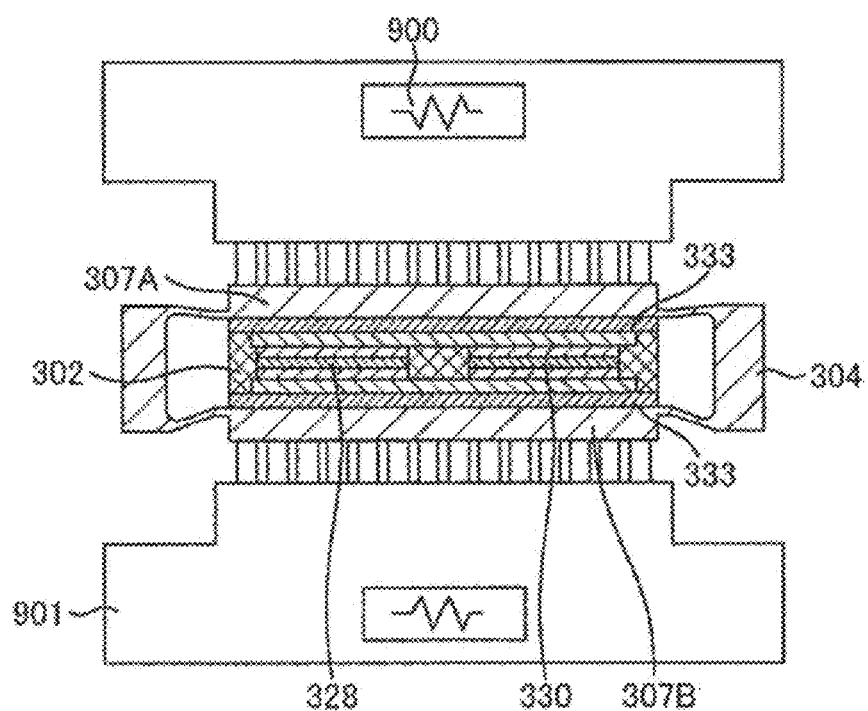
FIG. 28 is a diagram for explaining the process of pressure bonding by vacuum heating.

FIG. 28 is a diagram for explaining the process of pressure bonding by vacuum heating. The first heat releasing member 307A of the module case 304 is placed on a pressing machine 901 that contains a heater 900. The space surrounding the primary module sealed unit 302 is then vacuated, to eliminate contained air such as voids formed in the interfaces of the adhesive insulating members 333. The first heat releasing member 307A is then baked at a high temperature for a few hours while being pressed from above and below, to facilitate hardening of the adhesive agent. Through these procedures, the reliability such as insulation life of the insulating members 333 can be improved. Accordingly, a small-sized, highly-reliable power conversion apparatus can be provided.

At this point, the insulating members 333 preferably have adhesion properties. Further, the insulating members 333 are preferably made of a material that is thermally hardened by temperature changes caused by the above mentioned heater 900.

Although vacuum-heating pressure bonding is performed after the plate spring force adjustment process in this embodiment, the plate spring force adjustment may be performed after the vacuum-heating pressure bonding.

The preferred insulating members 333 for the power semiconductor modules 300 according to this embodiment are now described. The insulating members 333 according to this embodiment are expected to secure electrical insulation between the inner walls of the module case 304 and the primary module sealed unit 302, and also secure adhesion therebetween. However, the heat releasing surfaces of the primary module sealed unit 302 are formed with the conductor plates 318 and 319 and the first sealing resin 348 as shown in FIG. 14. Therefore, if concavities and convexities appear in the boundaries between the conductor plates 318 and 319 and the first sealing resin 348, the adhesion to the insulating members 333 may become lower. As a result, the air or the like forms voids between the insulating members 333 and the primary module sealed unit 302, and a decrease in the heat transfer rate of the power semiconductor modules 300 or partial discharge may be caused. Likewise, air intrusion or the like in minute voids may occur due to the surface roughness of the inner walls of the module case 304 and the conductor plates 318 and 319, and a decrease in the heat transfer rate of the power semiconductor modules 300 or partial discharge may be caused.

In view of the above, the insulating members 333 are preferably made of an insulating material that is soft or has a low Young's modulus so as to fill the concavities and convexities in the boundaries between the conductor plates 318 and 319 and the primary module sealed unit 302, or the minute voids formed due to the surface roughness of the inner walls of the module case 304 and the conductor plates 318 and 319.

However, an insulating material having a low Young's modulus contains a large amount of impurities that are different from the material for securing electrical insulation, and sufficient electrical insulation might not be secured.

In view of this, the insulating members 333 according to this embodiment include an insulating material that contains a smaller amount of impurities or has a high Young's modulus, and the above mentioned insulating material having a low Young's modulus, in the spaces between the insulating members 333 and the inner walls of the module case 304. That is, each of the insulating members 333 is in the form of multi-layers formed with insulating materials that differ in Young's modulus from each other. With this arrangement, decreases in heat transfer rate can be restrained, and electrical insulation can be secured.

Specifically, in each of the insulating members 333, an upper layer and a lower layer are made of an insulating material having a low Young's modulus, and an intermediate layer is made of an insulating material having a high Young's modulus.

Furthermore, if a thermosetting material is used, the Young's modulus thereof is low at a low temperature, and accordingly, the insulating members 333 easily fill the concavities and convexities in the boundaries between the conductor plates 318 and 319 and the primary module sealed unit 302, or the minute voids formed due to the surface roughness of the inner walls of the module case 304 and the conductor plates 318 and 319.

If the residual compressive stress generated by the plate spring is too high, the insulating members 333 might be broken, and the insulation might become lower. In this embodiment, the plate spring force can be adjusted by controlling the height X of the step of the first joining member 304A (the adjustment portion).

With this arrangement, even in an embodiment using a can-type cooling case as shown in FIG. 13, decreases in heat transfer rate can be restrained, and electrical insulation can be secured.

As described above, vacuum-heating pressure bonding is performed after residual compressive stress is generated in the primary module sealed unit 302, so that insulating sheet detachment can be prevented, and the primary module sealed unit 302 can be firmly fixed to the inner walls of the module case 304. In this structure, heat generated from the power semiconductor devices is transferred to the module case 304 via the adhesive insulating members 333 provided on both side surfaces of the primary module sealed unit 302. Accordingly, heat can be released from both sides of each power semiconductor device. Also, as the heat conduction path from the power semiconductor devices to the cooling medium is divided into two parallel paths, thermal resistance can be greatly lowered, and the power semiconductor modules and the power conversion apparatus can be made smaller in size.

Furthermore, as the plate spring portions and the adjustment portions are formed by pressing, the power semiconductor modules can be provided with high productivity and at low costs.

REFERENCE SIGNS LIST 300U, 300V, 300W power semiconductor module
302 primary module sealed unit
304 module case
304A first joining member
304C second joining member
305 fin
306C sidewall portion
307A first heat releasing member
307B second heat releasing member
328, 330 IGBT
333 insulating member
L1 adjustment portion length
L2 plate spring portion length

The invention claimed is:
1. A power semiconductor module comprising:
a semiconductor device configured to perform conversion into DC power and AC power; conductor plates placed on both sides of the semiconductor device, the conductor plates being connected to electrode surfaces of the semiconductor device with solder; a sealed unit having the semiconductor device and the conductor plates sealed therein with resin; a case for housing the sealed unit; and an insulating member placed between the sealed unit and the case, wherein the case comprises:
a first heat releasing member facing one surface of the sealed unit;
a second heat releasing member facing another surface of the sealed unit on the opposite side from the one surface;

a first joining member connected to the first heat releasing member while surrounding the first heat releasing member;
a second joining member connected to the second heat releasing member while surrounding the second heat releasing member; and
a sidewall portion connected to the first joining member and the second joining member,
the second joining member has a larger amount of springback than an amount of springback of the first joining member, and
the sealed unit is subjected to compressive stress generated from a difference in the amounts of springback between the first joining member and the second joining member,
wherein a length of the second joining member is greater than a length of the first joining member.

2. The power semiconductor module according to claim 1, wherein
thicknesses of the first joining member and the second joining member are smaller than respective thicknesses of the first heat releasing member, the second heat releasing member, and the sidewall portion, and
rigidities of the first joining member and the second joining member are lower than respective rigidities of the first heat releasing member, the second heat releasing member, and the sidewall portion.

3. The power semiconductor module according to claim 1, wherein,
a connecting portion between the first heat releasing member and the first joining member is defined as a first connecting portion, a connecting portion between the first joining member and the sidewall portion is defined as a second connecting portion, a connecting portion between the second heat releasing member and the second joining member is defined as a third connecting portion, and a connecting portion between the second joining member and the sidewall portion is defined as a fourth connecting portion, and
a length of the second joining member from the third connecting portion to the fourth connecting portion is greater than a length of the first joining member from the first connecting portion to the second connecting portion.

4. The power semiconductor module according to claim 3, wherein the second joining member, or both the first joining member and the second joining member include a curved portion.

5. The power semiconductor module according to claim 3, wherein the second heat releasing member projects from a direction perpendicular to a facing surface of the first heat releasing member facing the sealed unit and has a smaller projective portion than a projective portion of the first heat releasing member.

6. The power semiconductor module according to claim 1, wherein
the first heat releasing member and the first joining member are integrally formed,
the second heat releasing member and the second joining member are integrally formed,
the first joining member is joined to the sidewall portion by laser welding or friction stir welding, and
the second joining member is joined to the sidewall portion by laser welding or friction stir welding.

7. The power semiconductor module according to claim 6, wherein
the first joining member has a convex shape bulging toward the side of the sealed unit, and
the second joining member has a convex shape bulging toward the opposite side from the sealed unit.

8. The power semiconductor module according to claim 7, wherein a height of the convex shape differs between the first connecting portion and the second connecting portion.

9. The power semiconductor module according to claim 1, wherein the first joining member and the second joining member are made of different materials from each other.

10. A power semiconductor module comprising:
a semiconductor device configured to perform conversion into DC power and AC power; conductor plates placed on both sides of the semiconductor device, the conductor plates being connected to electrode surfaces of the semiconductor device with solder; a sealed unit having the semiconductor device and the conductor plates sealed therein with resin; a case for housing the sealed unit; and an insulating member placed between the sealed unit and the case, wherein the case comprises:
a first heat releasing member facing one surface of the sealed unit;
a second heat releasing member facing another surface of the sealed unit on the opposite side from the one surface;
a first joining member connected to the first heat releasing member while surrounding the first heat releasing member;
a second joining member connected to the second heat releasing member while surrounding the second heat releasing member; and
a sidewall portion connected to the first joining member and the second joining member,
the sidewall portion is covered with the first heat releasing member and the first joining member on one end, and is covered with the second heat releasing member and the second joining member on another end,
the second joining member has a larger amount of springback than an amount of springback of the first joining member, and
the sealed unit is subjected to compressive stress generated from a difference in the amounts of springback between the first joining member and the second joining member,
wherein a length of the second joining member is greater than a length of the first joining member.

* * * * *